United States Patent
Vashi et al.

(10) Patent No.: US 10,892,024 B2
(45) Date of Patent: Jan. 12, 2021

(54) SCAN OPTIMIZATION FROM STACKING MULTIPLE RELIABILITY SPECIFICATIONS

(71) Applicant: Micron Technology, Inc., Boise, ID (US)

(72) Inventors: Ankit Vashi, Milpitas, CA (US); Harish Reddy Singidi, Fremont, CA (US); Kishore Kumar Muchherla, Fremont, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/232,185

(22) Filed: Dec. 26, 2018

(65) Prior Publication Data

US 2020/0211664 A1    Jul. 2, 2020

(51) Int. Cl.
| | | |
|---|---|---|
| G11C 16/34 | (2006.01) | |
| G11C 11/406 | (2006.01) | |
| G11C 16/26 | (2006.01) | |
| G11C 29/10 | (2006.01) | |
| G06F 11/00 | (2006.01) | |
| G11C 16/10 | (2006.01) | |

(52) U.S. Cl.
CPC ........ *G11C 16/3431* (2013.01); *G06F 11/008* (2013.01); *G11C 11/40615* (2013.01); *G11C 11/40626* (2013.01); *G11C 16/10* (2013.01); *G11C 16/26* (2013.01); *G11C 16/349* (2013.01); *G11C 29/10* (2013.01); *G11C 2211/406* (2013.01)

(58) Field of Classification Search
CPC ........ G11C 11/40626; G11C 11/40618; G11C 11/40615; G11C 16/0483; G11C 16/3431; G11C 16/3418; G11C 16/349; G11C 16/3425

USPC .... 365/222, 185.02, 185.09, 185.11, 185.17, 365/185.03

See application file for complete search history.

(56) References Cited

U.S. PATENT DOCUMENTS

| | | |
|---|---|---|
| 7,184,313 B2 | 2/2007 | Betser et al. |
| 9,858,002 B1 * | 1/2018 | Goss ..................... G06F 3/0619 |
| 10,490,288 B1 * | 11/2019 | Wang ................. G11C 16/0483 |
| 2016/0117216 A1 * | 4/2016 | Muchherla .......... G06F 11/1048 714/6.11 |
| 2018/0046231 A1 | 2/2018 | Raghu et al. |

OTHER PUBLICATIONS

Cai, Yu, et al., "Flash Correct-and-Refresh", Carnegie Mellon, 56 pgs.

Khan, Baseem, et al., "A Power Flow Tracing Based Method for Transmission Usage, Loss & Reliablity Margin Allocation", Science Direct AASRI Procedia 7, (2014), 94-100.

* cited by examiner

*Primary Examiner* — Alfredo Bermudez Lozada
(74) *Attorney, Agent, or Firm* — Schwegman Lundberg & Woessner, P.A.

(57) ABSTRACT

A variety of applications can include systems and/or methods of optimizing results from scanning a memory device, where the memory device has stacked multiple reliability specifications. Information about a block of multiple blocks of a memory device can be logged, where the information is associated with a combination of reliability specifications. A refresh of the block can be triggered based on exceeding a threshold condition for the combination of reliability specifications.

25 Claims, 7 Drawing Sheets

SCAN OPTIMIZATION FROM STACKING MULTIPLE RELIABILITY SPECIFICATIONS

BACKGROUND

Memory devices are typically provided as internal, semiconductor, integrated circuits in computers or other electronic devices. There are many different types of memory, including volatile and non-volatile memory. Volatile memory requires power to maintain its data, and examples of volatile memory include random-access memory (RAM), dynamic random-access memory (DRAM), and synchronous dynamic random-access memory (SDRAM), among others. Non-volatile memory can retain stored data when not powered, and examples of non-volatile memory include flash memory, read-only memory (ROM), electrically erasable programmable ROM (EEPROM), static RAM (SRAM), erasable programmable ROM (EPROM), resistance variable memory, such as phase-change random-access memory (PCRAM), resistive random-access memory (RRAM), magnetoresistive random-access memory (MRAM), and three-dimensional (3D) XPoint™ memory, among others.

Flash memory is utilized as non-volatile memory for a wide range of electronic applications. Flash memory devices typically include one or more groups of one-transistor, floating gate or charge trap memory cells that allow for high memory densities, high reliability, and low power consumption. Two common types of flash memory array architectures include NAND and NOR architectures, named after the logic form in which the basic memory cell configuration of each is arranged. The memory cells of the memory array are typically arranged in a matrix. In an example, the gates of each floating gate memory cell in a row of the array are coupled to an access line (e.g., a word line). In a NOR architecture, the drains of each memory cell in a column of the array are coupled to a data line (e.g., a bit line). In a NAND architecture, the memory cells in a string of the array are coupled together in series, source to drain, between a source line and a bit line.

Both NOR and NAND architecture semiconductor memory arrays are accessed through decoders that activate specific memory cells by selecting the word line coupled to their gates. In a NOR architecture semiconductor memory array, once activated, the selected memory cells place their data values on bit lines, causing different currents to flow depending on the state at which a particular cell is programmed. In a NAND architecture semiconductor memory array, a high bias voltage is applied to a drain-side select gate (SGD) line. Word lines coupled to the gates of the unselected memory cells of each group are driven at a specified pass voltage (e.g., Vpass) to operate the unselected memory cells of each group as pass transistors (e.g., to pass current in a manner that is unrestricted by their stored data values). Current then flows from the source line to the bit line through each series coupled group, restricted only by the selected memory cells of each group, placing current encoded data values of selected memory cells on the bit lines.

Each flash memory cell in a NOR or NAND architecture semiconductor memory array can be programmed individually or collectively to one or a number of programmed states. For example, a single-level cell (SLC) can represent one of two programmed states (e.g., 1 or 0), representing one bit of data. However, flash memory cells can also represent one of more than two programmed states, allowing the manufacture of higher density memories without increasing the number of memory cells, as each cell can represent more than one binary digit (e.g., more than one bit). Such cells can be referred to as multi-state memory cells, multi-digit cells, or multi-level cells (MLCs). In certain examples, MLC can refer to a memory cell that can store two bits of data per cell (e.g., one of four programmed states), a triple-level cell (TLC) can refer to a memory cell that can store three bits of data per cell (e.g., one of eight programmed states), and a quad-level cell (QLC) can store four bits of data per cell. Unless otherwise clearly indicated by express language or context, MLC is used herein in its broader context, to can refer to any memory cell that can store more than one bit of data per cell (i.e., that can represent more than two programmed states).

Traditional memory arrays are two-dimensional (2D) structures arranged on a surface of a semiconductor substrate. To increase memory capacity for a given area, and to decrease cost, the size of the individual memory cells has decreased. However, there is a technological limit to the reduction in size of the individual memory cells, and thus, to the memory density of 2D memory arrays. In response, three-dimensional (3D) memory structures, such as 3D NAND architecture semiconductor memory devices, are being developed to further increase memory density and lower memory cost.

Such 3D NAND devices often include strings of storage cells, coupled in series (e.g., drain to source), between one or more source-side select gates (SGSs) proximate a source, and one or more drain-side select gates (SGDs) proximate a bit line. In an example, the SGSs or the SGDs can include one or more field-effect transistors (FETs) or metal-oxide semiconductor (MOS) structure devices, etc. In some examples, the strings will extend vertically, through multiple vertically spaced tiers containing respective word lines. A semiconductor structure (e.g., a polysilicon structure) may extend adjacent a string of storage cells to form a channel for the storage cells of the string. In the example of a vertical string, the polysilicon structure may be in the form of a vertically extending pillar. In some examples, the string may be "folded," and thus arranged relative to a U-shaped pillar. In other examples, multiple vertical structures may be stacked upon one another to form stacked arrays of storage cell strings.

Memory arrays or devices can be combined together to form a storage volume of a memory system, such as a solid-state drive (SSD), a Universal Flash Storage (UFS™) device, a MultiMediaCard (MMC) solid-state storage device, an embedded MMC device (eMMC™), etc, An SSD can be used as, among other things, the main storage device of a computer, having advantages over traditional hard drives with moving parts with respect to, for example, performance, size, weight, ruggedness, operating temperature range, and power consumption. For example, SSDs can have reduced seek time, latency, or other delay associated with magnetic disk drives (e.g., electromechanical, etc.), SSDs use non-volatile memory cells, such as flash memory cells, to obviate internal battery supply requirements, thus allowing the drive to be more versatile and compact.

An SSD can include a number of memory devices, including a number of dies or logical units (e.g., logical unit numbers or LUNs), and can include one or more processors or other controllers performing logic functions required to operate the memory devices or interface with external systems. Such SSDs may include one or more flash memory die, including a number of memory arrays and peripheral circuitry thereon. The flash memory arrays can include a number of blocks of memory cells organized into a number of physical pages. In many examples, the SSDs will also include DRAM or SRAM (or other forms of memory die or other memory structures). The SSD can receive commands from a host in association with memory operations, such as read or write operations, to transfer data (e.g., user data and associated integrity data, such as error data and address data, etc.) between the memory devices and the host, or erase operations to erase data from the memory devices.

In NAND flash based storage systems, a memory cell arranged as SLC or MLC typically contains a charge storage transistor in which the charge stored in the charge storage transistor sets a threshold voltage, $V_t$, of the charge storage transistor. Internal logic of the NAND fixes an association of a different threshold voltage with each state. However, NAND $V_t$s are constantly subjected to shifts due to any of a number of factors. Such factors include read disturb, retention, cross-temperature etc. A count of failed bits can include a function of the mismatch between a value of the read voltage and the NAND Vt.

To monitor the error status of a memory device, a scan of the memory device can be periodically made. A scan involves the reading of data and analysis of parameters associated with the data read. For example, a scan can be issued to a NAND memory device to calibrate NAND read voltages, measure the NAND raw bit error rates (RBERs), determine optimal read voltages for an optimal RBER, and determine an error in the data. Traditional scans do not provide coverage for stacking of multiple reliability margin loss conditions. In general, reliability margin can be defined as a condition where threshold voltage of NAND cells to be written is determined such that there is no corruption of written data over the lifetime of the NAND usage. In order to achieve reliability requirements for customer usage, the NAND cells are written such that, when exposed to any kind of stress in customer usage environment (i.e. temperature bake, multiple read or write operations, etc.), the written data remains intact and is not corrupted. However, in a condition when the written data does get corrupted, it is considered to be a reliability margin loss condition.

For example, traditional scans do not cover the combination of a data retention specification and a cross temperature specification for a NAND memory device. A data retention specification of a memory device is a parameter to be met by the memory device referring to the ability of a memory bit programmed in the memory device to retain its data state over long periods of time. For example, data retention of a NAND memory device is basically the amount of time the NAND memory device can hold the data programmed in the NAND memory device with reference to a particular temperature, which provides an expected time to be able to hold the data and be able to read the data correctly. Cross temperature refers to a operational temperature range between the temperature at which data is programmed and the temperature at which the data is read. A high cross temperature can result in data errors. A cross temperature delta can be defined as the difference in temperature between the temperature at which data is programmed and the temperature at which the data is read.

BRIEF DESCRIPTION OF THE DRAWINGS

The drawings, which are not necessarily drawn to scale, illustrate generally, by way of example, but not by way of limitation, various embodiments discussed in the present document.

DETAILED DESCRIPTION

Figure 1:
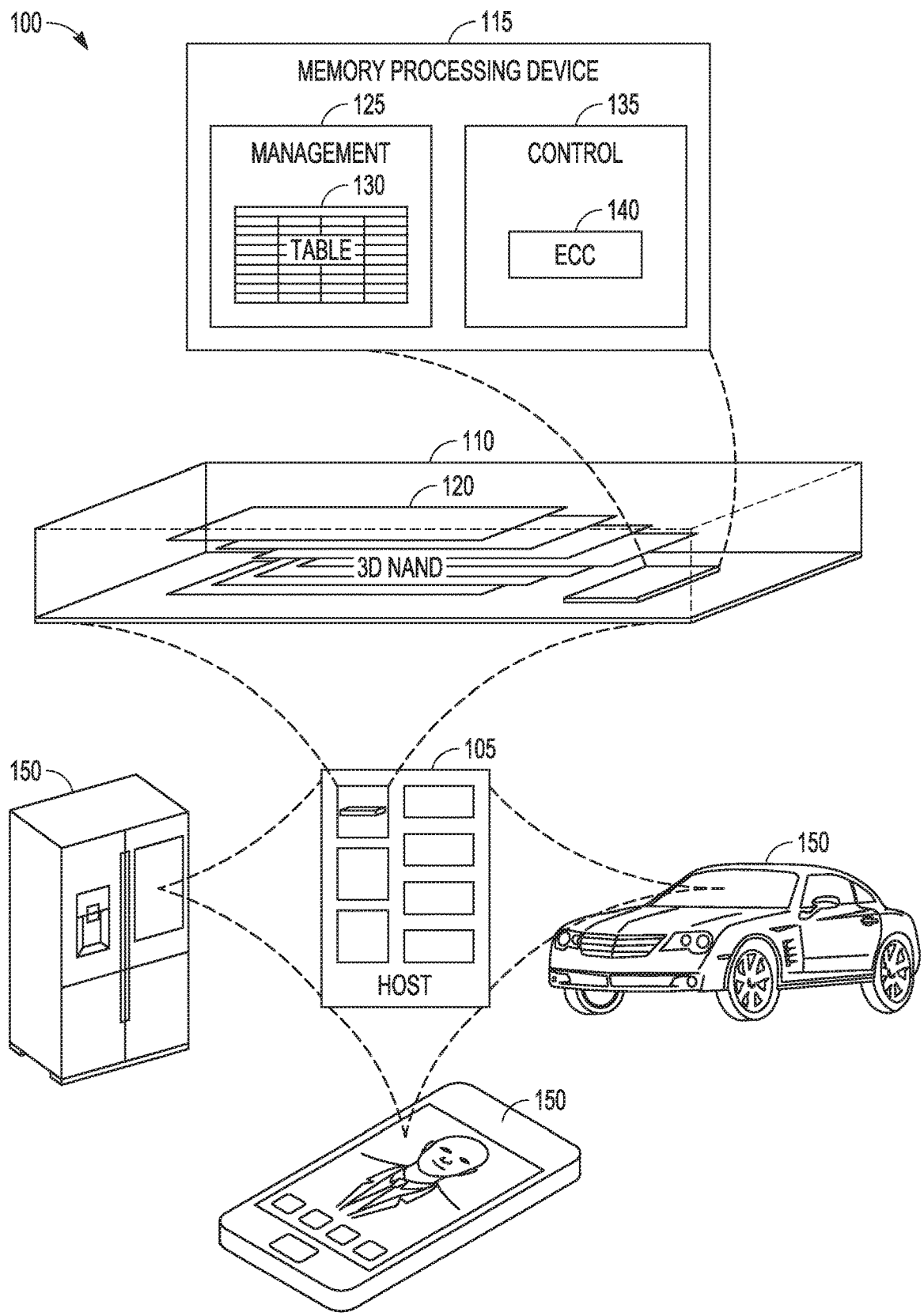
FIG. 1 illustrates an example of an environment including a memory device, according to various embodiments.

The following detailed description refers to the accompanying drawings that show, by way of illustration and not limitation, various embodiments in which an invention can be practiced. These embodiments are described in sufficient detail to enable those skilled in the art to practice these and other embodiments. Other embodiments may be utilized, and structural, logical, mechanical, and electrical changes may be made to these embodiments. The various embodiments are not necessarily mutually exclusive, as some embodiments can be combined with one or more other embodiments to form new embodiments. The following detailed description is, therefore, not to be taken in a limiting sense.

Problems associated with traditional scans can be explained with respect to usage models. In a first usage model, if a sample page of a block of a memory device fails a scan and a cross temperature delta between write temperature and scan temperature of the page is within a certain threshold for a cross temperature delta, a refresh is triggered. This refresh is based on a data retention specification with the page within limits of a cross temperature delta specification. The refresh can be based on a limit for an allowable bit error rate to meet the data retention specification, which can be part of a reliability specification for data retention. The refresh of a block can include writing the data of the block to another block and erasing the block being refreshed. In a second usage model, if a sample page of a block of a memory device fails a scan and a cross temperature delta between write temperature and scan temperature of the page exceeds the certain threshold for a cross temperature delta, a refresh is not triggered. The failed scan may be due to data retention, high cross temperature delta, or a combination of both data retention and high cross temperature delta. The refresh is not triggered, since basis for the failed scan is not determined.

In traditional scans for the second usage model in which a refresh is not triggered, if there are any high cross temperature static blocks, that is, blocks that are not overwritten, then these blocks will be subjected to more bake and may eventually cause unrecoverable errors. Bake refers to data being programmed at a temperature without operating on the data for some time interval. On the other hand, if the high cross temperature blocks are refreshed, excessive refresh in targeted high cross temperature conditions may occur. This excessive refresh could result in higher write amplification and performance degradation. Write amplification is a condition associated with flash memories and solid-state drives in which the actual amount of information physically written to the storage media is a multiple of the logical amount intended to be written.

In various embodiments, a response to a scan can be implemented to strike a balance between the reliability exposure of the second usage model and at the same time minimize the overkill for performance benchmarks. This approach can provide an optimization of responses to scan results. The usage and exposure to various reliability conditions to which respective blocks have undergone can be assessed. Once the stacking of reliability conditions of concern has been identified, storing required information for each block and triggering refresh, based on threshold conditions defined, can provide better coverage to stacking of reliability issues observed in the system. A reliability specification for a memory device defines operating parameters of the memory device that can be associated with total data errors, scan errors, bit rate errors over time and/or temperature, or other data error criteria. A reliability specification can include a specification for an operating range for a memory device, for which operation outside the specified range can result in data errors. For example, a specification can include a specified temperature range for which data errors may be expected for operation above the specified temperature.

An example of stacked reliability specification can include a combination of a data retention specification and a cross temperature delta specification. For this stacked combination, information can be logged for each block that fails a scan but is not triggered for refresh due to a check of a difference between a write and a read temperature resulting in the cross temperature delta exceeding a threshold cross temperature delta. A threshold cross temperature delta is predefined, where this difference can be referred to as a predefined difference between write and read temperature delta. The threshold cross temperature delta can be taken to be a magnitude (absolute value) value, which can be loaded into system storage devices and used in evaluation of blocks in a memory device, such as a NAND memory device. The threshold cross temperature delta can be changed according to changes in the cross temperature delta specification for the memory device.

The information to be logged can include power-on times. Power-on time for a block of memory is the amount of time after the block is opened. A threshold power-on time can be stored in a storage device to provide an evaluation parameter for a reliability specification such as a cross temperature delta specification. The threshold power-on time is a predefined power-on time for the given reliability specification, which can be changed according to applications of the reliability specification. Alternatively, if there is no power-on time logging capability for a block, a number of scans, N, can be logged. The number of scans is the number of scans conducted since the block was last refreshed with the cross temperature delta exceeding the threshold cross temperature delta. A counter arrangement can be implemented for use of the number of scans parameter. In addition, both the power-on times and number of scans can be logged. In addition, the temperature at which a page of a block is written and the temperature of the page at the time of a scan can be logged. From these logged temperatures, a corresponding cross temperature delta can be determined and logged. Alternatively, the temperature at which a page of a block is written and the cross temperature delta at the time of a scan can be logged, where the temperature determined at the time of the scan can be used to generate the cross temperature delta but is not logged in a storage device. The appropriate temperatures can be determined using a temperature sensor in a memory device and/or a temperature sensor associated with the processing device controlling the writing and reading to memory devices associated with the processing device. Multiple temperature sensors can be implemented to determine the appropriate temperatures.

Consider the following use of logged power-on time information with respect to handling scan optimization with respect to data reliability. If, or when, a given block has an erase count (EC) and the same block with the same EC fails a scan with the cross temperature delta exceeding the threshold cross temperature delta and with a current determined power-on time exceeding the threshold power-on time, then a refresh of the given block can be triggered.

Consider the following use of logged number of scans with respect to handling scan optimization with respect to data reliability. If, or when, a given block has an erase count (EC) and the same block with the same EC fails a scan with the cross temperature delta exceeding the threshold cross temperature delta for number of scans, then a refresh of the given block can be triggered. The number of scans, N, is a variable that can be monitored, for example, using a counter arrangement that can be reset after a refresh. A threshold parameter for the number of scans is a parameter that can be fixed for an analysis but can be updated in the firmware that controls the scan and evaluation process. The number of scans threshold condition can be used when the system does not have power-on time logging capability. In various embodiments, both threshold conditions can be used. Firmware of the system can set one of the threshold conditions to supersede the other threshold conditions stored in a storage device of the system. For example, the power-on time threshold condition can be selected as the predominant threshold condition for a force refresh criteria. Such approaches can provide data loss coverage for NAND blocks impacted by stacking of multiple reliability margin loss.

Electronic devices, such as mobile electronic devices (e.g., smart phones, tablets, etc.), electronic devices for use in automotive applications (e.g., automotive sensors, control units, driver-assistance systems, passenger safety or comfort systems, etc.), and internet-connected appliances or devices (e.g., internet-of-things (IoT) devices, etc.), have varying storage needs depending on, among other things, the type of electronic device, use environment, performance expectations, etc.

Electronic devices can be broken down into several main components: a processor (e.g., a central processing unit (CPU) or other main processor); memory (e.g., one or more volatile or non-volatile random-access memory (RAM) memory device, such as dynamic RAM (DRAM), mobile or low-power double-data-rate synchronous DRAM (DDR SDRAM), etc.) and a storage device (e.g., non-volatile memory (NVM) device, such as flash memory, read-only memory (ROM), an SSD, an MMC, or other memory card structure or assembly, etc.). In certain examples, electronic devices can include a user interface (e.g., a display, touchscreen, keyboard, one or more buttons, etc.), a graphics processing unit (GPU), a power management circuit, a baseband processor or one or more transceiver circuits, etc.

FIG. 1 illustrates an example of an environment 100 including a host device 105 and a memory device 110 configured to communicate over a communication interface. The host device 105 or the memory device 110 may be included in a variety of products 150, such as Internet of Things (IoT) devices (e.g., a refrigerator or other appliance, sensor, motor or actuator, mobile communication device, automobile, drone, etc.) to support processing, communications, or control of the product 150.

The memory device 110 includes a memory processing device 115 and a memory array 120 including, for example, a number of individual memory die (e.g., a stack of three-dimensional (3D) NAND die). In 3D architecture semiconductor memory technology, vertical structures are stacked, increasing the number of tiers, physical pages, and accordingly, the density of a memory device (e.g., a storage device). In an example, the memory device 110 can be a discrete memory or storage device component of the host device 105. In other examples, the memory device 110 can be a portion of an integrated circuit (e.g., system on a chip (SOC), etc.), stacked or otherwise included with one or more other components of the host device 105.

One or more communication interfaces can be used to transfer data between the memory device 110 and one or more other components of the host device 105, such as a Serial Advanced Technology Attachment (SATA) interface, a Peripheral Component Interconnect Express (PCIe) interface, a Universal Serial Bus (USB) interface, a Universal Flash Storage (UFS) interface, an eMMC™ interface, or one or more other connectors or interfaces. The host device 105 can include a host system, an electronic device, a processor, a memory card reader, or one or more other electronic devices external to the memory device 110. In some examples, the host device 105 may be a machine having some portion, or all, of the components discussed in reference to the machine 500 of FIG. 5.

The memory processing device 115 can receive instructions from the host device 105, and can communicate with the memory array 120, such as to transfer data to (e.g., write or erase) or from (e.g., read) one or more of the memory cells, planes, sub-blocks, blocks, or pages of the memory array 120. The memory processing device 115 can include, among other things, circuitry or firmware, including one or more components or integrated circuits. For example, the memory processing device 115 can include one or more memory control units, circuits, or components configured to control access across the memory array 120 and to provide a translation layer between the host device 105 and the memory device 110. The memory processing device 115 can include one or more input/output (I/O) circuits, lines, or interfaces to transfer data to or from the memory array 120. The memory processing device 115 can include a memory manager 125 and an array controller 135.

The memory manager 125 can include, among other things, circuitry or firmware, such as a number of components or integrated circuits associated with various memory management functions. For purposes of the present description, example memory operation and management functions will be described in the context of NAND memory. Persons skilled in the art will recognize that other forms of non-volatile memory may have analogous memory operations or management functions. Such NAND management functions include wear leveling (e.g., garbage collection or reclamation), error detection or correction, block retirement, or one or more other memory management functions. The memory manager 125 can parse or format host commands (e.g., commands received from a host) into device commands (e.g., commands associated with operation of a memory array, etc.), or generate device commands (e.g., to accomplish various memory management functions) for the array controller 135 or one or more other components of the memory device 110.

The memory manager 125 can include a set of management tables 130 configured to maintain various information associated with one or more component of the memory device 110 (e.g., various information associated with a memory array or one or more memory cells coupled to the memory processing device 115). For example, the management tables 130 can include information regarding block age, block erase count, error history, or one or more error counts (e.g., a write operation error count, a read bit error count, a read operation error count, an erase error count, etc.) for one or more blocks of memory cells coupled to the memory processing device 115. In certain examples, if the number of detected errors for one or more of the error counts is above a threshold, the bit error can be referred to as an uncorrectable bit error. The management tables 130 can maintain a count of correctable or uncorrectable bit errors, among other things.

The array controller 135 can include, among other things, circuitry or components configured to control memory operations associated with writing data to, reading data from, or erasing one or more memory cells of the memory device 110 coupled to the memory processing device 115. The memory operations can be based on, for example, host commands received from the host device 105, or internally generated by the memory manager 125 (e.g., in association with wear leveling, error detection or correction, etc.).

The array controller 135 can include an error correction code (ECC) component 140, which can include, among other things, an ECC engine or other circuitry configured to detect or correct errors associated with writing data to or reading data from one or more memory cells of the memory device 110 coupled to the memory processing device 115. The memory processing device 115 can be configured to actively detect and recover from error occurrences (e.g., bit errors, operation errors, etc.) associated with various operations or storage of data, while maintaining integrity of the data transferred between the host device 105 and the memory device 110, or maintaining integrity of stored data (e.g., using redundant RAID storage, etc.), and can remove (e.g., retire) failing memory resources (e.g., memory cells, memory arrays, pages, blocks, etc.) to prevent future errors.

The memory array 120 can include several memory cells arranged in, for example, a number of devices, planes, sub-blocks, blocks, or pages. As one example, a 48 GB TLC NAND memory device can include 18,592 bytes (B) of data per page (16,384+2208 bytes), 1536 pages per block, 548 blocks per plane, and 4 or more planes per device. As another example, a 32 GB MLC memory device (storing two bits of data per cell (i.e., 4 programmable states)) can include 18,592 bytes (B) of data per page (16,384+2208 bytes), 1024 pages per block, 548 blocks per plane, and 4 planes per device, but with half the required write time and twice the program/erase (P/E) cycles as a corresponding TLC memory device. Other examples can include other numbers or arrangements. In some examples, a memory device, or a portion thereof, may be selectively operated in SLC mode, or in a desired MLC mode (such as TLC, QLC, etc.).

In operation, data is typically written to or read from the NAND memory device 110 in pages and erased in blocks. However, one or more memory operations (e.g., read, write, erase, etc.) can be performed on larger or smaller groups of memory cells, as desired. The data transfer size of a NAND memory device 110 is typically referred to as a page; whereas the data transfer size of a host is typically referred to as a sector.

Although a page of data can include a number of bytes of user data (e.g., a data payload including a number of sectors of data) and its corresponding metadata, the size of the page often refers only to the number of bytes used to store the user data. As an example, a page of data having a page size of 4 KB may include 4 KB of user data (e.g., 8 sectors assuming a sector size of 512 B) as well as a number of bytes (e.g., 32 B, 54 B, 224 B, etc.) of metadata corresponding to the user data, such as integrity data (e.g., error detecting or correcting code data), address data (e.g., logical address data, etc.), or other metadata associated with the user data.

Different types of memory cells or memory arrays 120 can provide for different page sizes or may require different amounts of metadata associated therewith. For example, different memory device types may have different bit error rates, which can lead to different amounts of metadata necessary to ensure integrity of the page of data (e.g., a memory device with a higher bit error rate may require more bytes of error correction code data than a memory device with a lower hit error rate). As an example, a multi-level cell (MLC) NAND flash device may have a higher bit error rate than a corresponding single-level cell (SLC) NAND flash device. As such, the MLC device may require more metadata bytes for error data than the corresponding SLC device.

Figure 2:
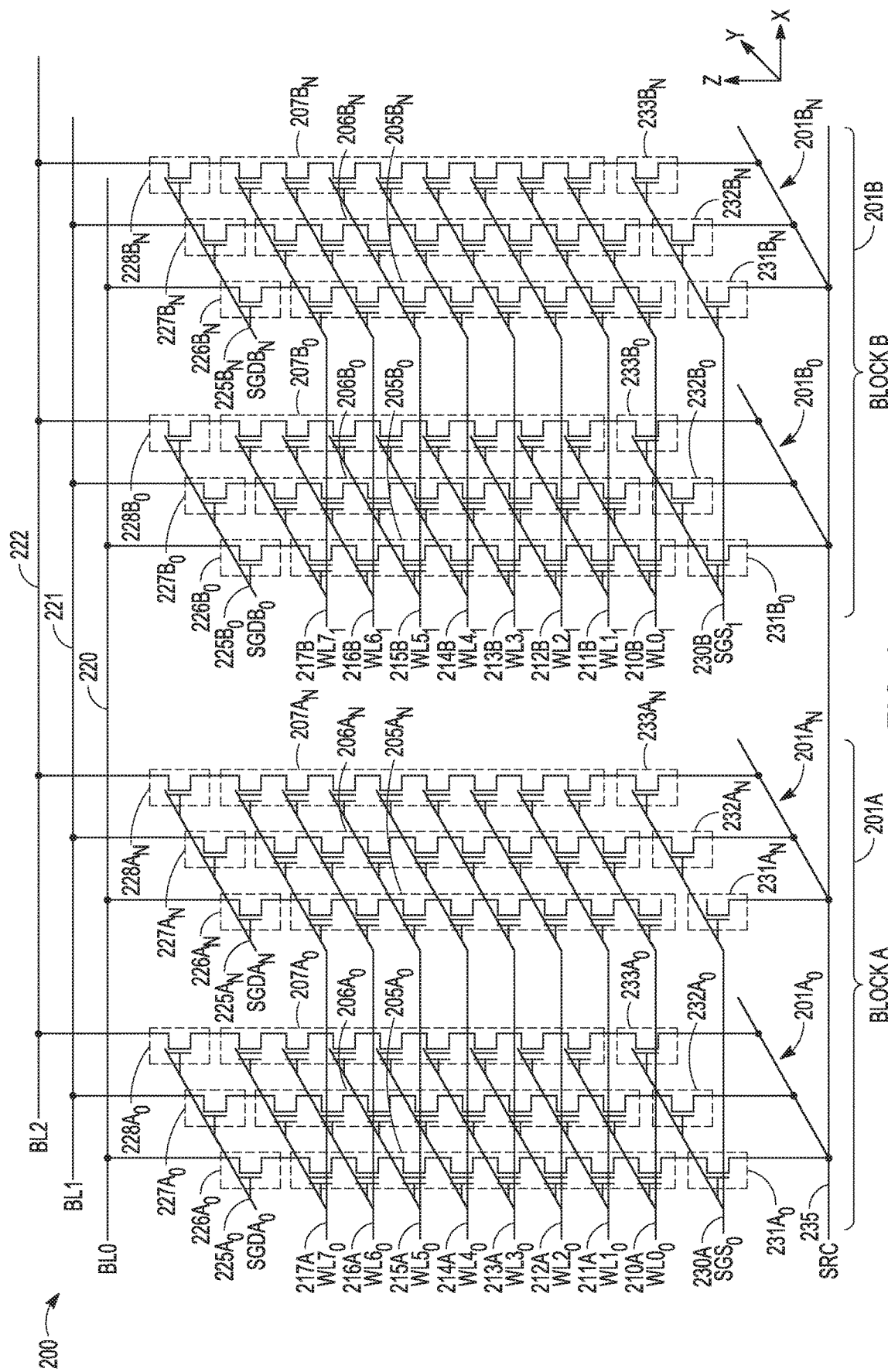
FIGS. 2 and 3 illustrate schematic diagrams of an example of a three-dimensional NAND architecture semiconductor memory array, according to various embodiments.

FIG. 2 illustrates an example schematic diagram of a 3D NAND architecture semiconductor memory array 200 including a number of strings of memory cells (e.g., first-third $A_0$ memory strings $205A_0$-$207A_0$, first-third $A_n$ memory strings $205A_n$-$207A_n$, first-third $B_0$ memory strings $205B_0$-$207B_0$, first-third memory strings $205B_n$-$207B_n$, etc.), organized in blocks (e.g., block A 201A, block B 201B, etc.) and sub-blocks (e.g., sub-block $A_0$ 201 $A_0$, sub-block $A_n$ 201$A_n$, sub-block $B_0$ 201$B_0$, sub-block $B_n$ 201$B_n$, etc.). The memory array 200 represents a portion of a greater number of similar structures than would typically be found in a block, device, or other unit of a memory device.

Each string of memory cells includes a number of tiers of charge storage transistors (e.g., floating gate transistors, charge-trapping structures, etc.) stacked in the Z direction, source to drain, between a source line (SRC) 235 or a source-side select gate (SGS) (e.g., first-third $A_0$ SGS $231A_0$-$233A_0$, first-third $A_n$ SGS $231A_n$-$233A_n$, first-third $B_0$ SGS $231B_0$-$233B_0$, first-third $B_n$ SGS $231B_n$-$233B_n$, etc.) and a drain-side select gate (SGD) (e.g., first-third $A_0$ SGD $226A_0$-$228A_0$, first-third $A_n$ SGD $226A_n$-$228A_n$, first-third $B_0$ SOD $226B_0$-$228B_0$, first-third $B_n$ SGD $226B_n$-$228B_n$, etc.). Each string of memory cells in the 3D memory array can be arranged along the X direction as data lines (e.g., bit lines (BL) BL0-BL2 220-222), and along the Y direction as physical pages.

Within a physical page, each tier represents a row of memory cells, and each string of memory cells represents a column. A sub-block can include one or more physical pages, A block can include a number of sub-blocks (or physical pages) (e.g., 128, 256, 384, etc). Although illustrated herein as having two blocks, each block having two sub-blocks, each sub-block having a single physical page, each physical page having three strings of memory cells, and each string having 8 tiers of memory cells, in other examples, the memory array 200 can include more or fewer blocks, sub-blocks, physical pages, strings of memory cells, memory cells, or tiers. For example, each string of memory cells can include more or fewer tiers (e.g., 16, 32, 64, 128, etc.), as well as one or more additional tiers of semiconductor material above or below the charge storage transistors (e.g., select gates, data lines, etc.), as desired. As an example, a 48 GB TLC NAND memory device can include 18,592 bytes (B) of data per page (16,384+2208 bytes), 1536 pages per block, 548 blocks per plane, and 4 or more planes per device.

Each memory cell in the memory array 200 includes a control gate (CG) coupled to (e.g., electrically or otherwise operatively connected to) an access line (e.g., word lines (WL) $WL0_0$-$WL7_0$ 210A-217A, $WL0_1$-$WL7_1$ 210B-217B, etc.), which collectively couples the control gates (CGs) across a specific tier, or a portion of a tier, as desired. Specific tiers in the 3D memory array, and accordingly, specific memory cells in a string, can be accessed or controlled using respective access lines. Groups of select gates can be accessed using various select lines. For example, first-third $A_0$ SGD $226A_0$-$228A_0$ can be accessed using an $A_0$ SGD line $SGDA_0$ $225A_0$, first-third $A_n$ SGD $226A_n$-$228A_n$ can be accessed using an $A_n$ SGD line $SGDA_n$ $225A_n$, first-third $B_0$ SGD $226B_0$-$228B_0$ can be accessed using an $B_0$ SGD line $SGDB_0$ $225B_0$, and first-third $B_n$ SGD $226B_n$-$228B_n$ can be accessed using an $B_n$ SGD line $SGDB_n$ $225B_n$. First-third $A_0$ SGS $231A_0$-$233A_0$ and first-third $A_n$ SOS $231A_n$-$233A_n$ can be accessed using a gate select line $SGS_0$ 230A, and first-third Bo SGS $231B_0$-$233B_0$ and first-third $B_n$ SGS $231B_n$-$233B_n$, can be accessed using a gate select line $SGS_1$ 230B.

In an example, the memory array 200 can include a number of levels of semiconductor material (e.g., polysilicon, etc.) configured to couple the control gates (CGs) of each memory cell or select gate (or a portion of the CGs or select gates) of a respective tier of the array. Specific strings of memory cells in the array can be accessed, selected, or controlled using a combination of bit lines (BLs) and select gates, etc., and specific memory cells at one or more tiers in the specific strings can be accessed, selected, or controlled using one or more access lines (e.g., word lines).

Figure 3:
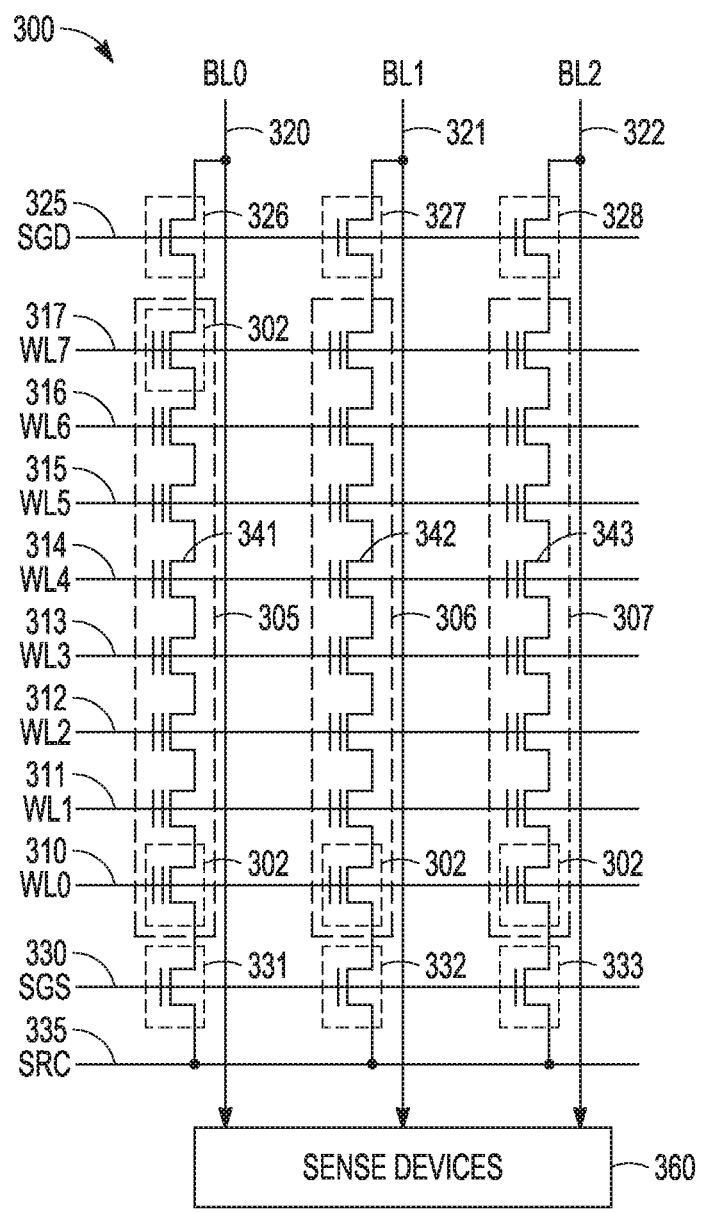

FIG. 3 illustrates an example schematic diagram of a portion of a NAND architecture semiconductor memory array 300 including a plurality of memory cells 302 arranged in a two-dimensional array of strings (e.g., first-third strings 305-307) and tiers (e.g., illustrated as respective word lines (WL) WL0-WL7 310-317, a drain-side select gate (SGD) line 325, a source-side select gate (SGS) line 330, etc.), and sense amplifiers or devices 360. For example, the memory array 300 can illustrate an example schematic diagram of a portion of one physical page of memory cells of a 3D NAND architecture semiconductor memory device, such as illustrated in FIG. 2.

Each string of memory cells is coupled to a source line (SRC) 335 using a respective source-side select gate (SGS) (e.g., first-third SGS 331-333), and to a respective data line (e.g., first-third bit lines (BL) BL0-BL2 320-322) using a respective drain-side select gate (SGD) (e.g., first-third SGD 326-328). Although illustrated with 8 tiers (e.g., using word lines (WL) WL0-WL7 310-317) and three data lines (BL0-BL2 326-328) in the example of FIG. 3, other examples can include strings of memory cells having more or fewer tiers or data lines, as desired.

In a NAND architecture semiconductor memory array, such as the example memory array 300, the state of a selected memory cell 302 can be accessed by sensing a current or voltage variation associated with a particular data line containing the selected memory cell. The memory array 300 can be accessed (e.g., by a control circuit, one or more processors, digital logic, etc.) using one or more drivers. In an example, one or more drivers can activate a specific memory cell, or set of memory cells, by driving a particular potential to one or more data lines (e.g., bit lines BL0-BL2), access lines (e.g., word lines WL0-WL7), or select gates, depending on the type of operation desired to be performed on the specific memory cell or set of memory cells.

To program or write data to a memory cell, a programming voltage (Vpgm) (e.g., one or more programming pulses, etc.) can be applied to selected word lines (e.g., WL4), and thus, to a control gate of each memory cell coupled to the selected word lines (e.g., first-third control gates (CGs) 341-343 of the memory cells coupled to WL4). Programming pulses can begin, for example, at or near 15V, and, in certain examples, can increase in magnitude during each programming pulse application. While the program voltage is applied to the selected word lines, a potential, such as a ground potential (e.g., Vss), can be applied to the data lines (e.g., bit lines) and substrates and thus the channels, between the sources and drains) of the memory cells targeted for programming, resulting in a charge transfer (e.g., direct injection or Fowler-Nordheim (FN) tunneling, etc.) from the channels to the floating gates of the targeted memory cells.

In contrast, a pass voltage (Vpass) can be applied to one or more word lines having memory cells that are not targeted for programming, or an inhibit voltage (e.g., Vcc) can be applied to data lines (e.g., bit lines) having memory cells that are not targeted for programming, for example, to inhibit charge from being transferred from the channels to the floating gates of such non-targeted memory cells. The pass voltage can be variable, depending, for example, on the proximity of the applied pass voltages to a word line targeted for programming. The inhibit voltage can include a supply voltage (Vcc), such as a voltage from an external source or supply (e.g., a battery, an AC-to-DC converter, etc.), relative to a ground potential (e.g., Vss).

As an example, if a programming voltage (e.g., 15V or more) is applied to a specific word line, such as WL4, a pass voltage of 10V can be applied to one or more other word lines, such as WL3, WL5, etc., to inhibit programming of non-targeted memory cells, or to retain the values stored on such memory cells not targeted for programming. As the distance between an applied program voltage and the non-targeted memory cells increases, the pass voltage required to refrain from programming the non-targeted memory cells can decrease. For example, where a programming voltage of 15V is applied to WL4, a pass voltage of 10V can be applied to WL3 and WL5, a pass voltage of 8V can be applied to WL2 and WL6, a pass voltage of 7V can be applied to WL1 and WL7, etc. In other examples, the pass voltages, or number of word lines, etc., can be higher or lower, or more or less. The sense devices 360, coupled to one or more of the data lines (e.g., first, second, or third bit lines (BL0-BL2) 320-322), can detect the state of each memory cell in respective data lines by sensing a voltage or current on a particular data line.

Between applications of one or more programming pulses (e.g., Vpgm), a verify operation can be performed to determine if a selected memory cell has reached its intended programmed state. If the selected memory cell has reached its intended programmed state, it can be inhibited from further programming. If the selected memory cell has not reached its intended programmed state, additional programming pulses can be applied. If the selected memory cell has not reached its intended programmed state after a particular number of programming pulses (e.g., a maximum number), the selected memory cell, or a string, block, or page associated with such selected memory cell, can be marked as defective.

To erase a memory cell or a group of memory cells (e.g., erasure is typically performed in blocks or sub-blocks), an erasure voltage (Vers) (e.g., typically Vpgm) can be applied to the substrates and thus the channels, between the sources and drains) of the memory cells targeted for erasure (e.g., using one or more bit lines, select gates, etc.), while the word lines of the targeted memory cells are kept at a potential, such as a ground potential (e.g., Vss), resulting in a charge transfer (e.g., direct injection or Fowler-Nordheim (FN) tunneling, etc.) from the floating gates of the targeted memory cells to the channels.

Figure 4:
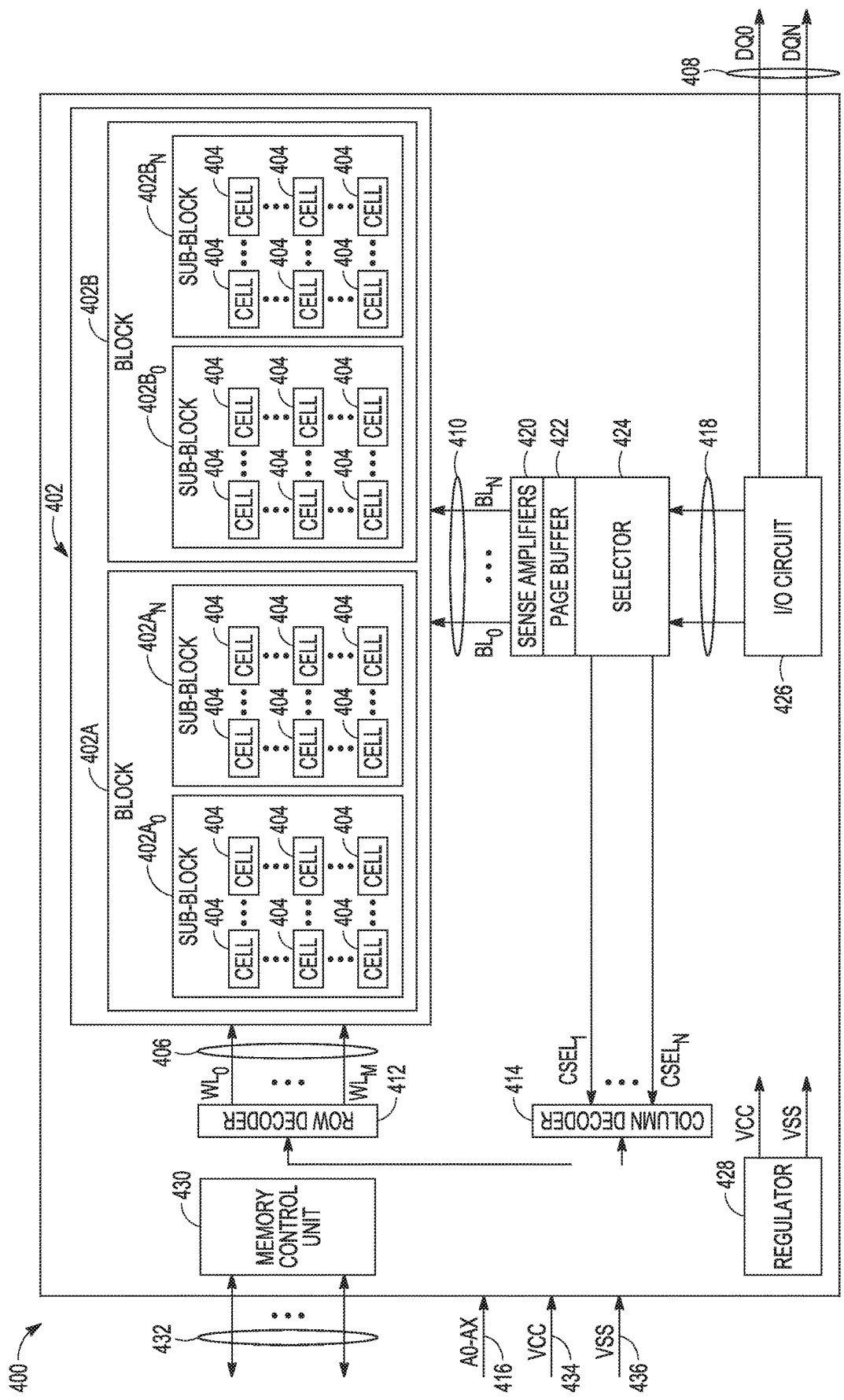
FIG. 4 illustrates an example block diagram of a memory module, according to various embodiments.

FIG. 4 illustrates an example block diagram of a memory device 400 including a memory array 402 having a plurality of memory cells 404, and one or more circuits or components to provide communication with, or perform one or more memory operations on, the memory array 402. The memory device 400 can include a row decoder 412, a column decoder 414, sense amplifiers 420, a page buffer 422, a selector 424, an input/output (I/O) circuit 426, and a memory control unit 430.

The memory cells 404 of the memory array 402 can be arranged in blocks, such as first and second blocks 402A, 402B. Each block can include sub-blocks. For example, the first block 402A can include first and second sub-blocks 402A$_0$, 402A$_n$, and the second block 402B can include first and second sub-blocks 402B$_0$, 402B$_n$. Each sub-block can include a number of physical pages, each page including a number of memory cells 404. Although illustrated herein as having two blocks, each block having two sub-blocks, and each sub-block having a number of memory cells 404, in other examples, the memory array 402 can include more or fewer blocks, sub-blocks, memory cells, etc. In other examples, the memory cells 404 can be arranged in a number of rows, columns, pages, sub-blocks, blocks, etc., and accessed using, for example, access lines 406, first data lines 410, or one or more select gates, source lines, etc.

The memory control unit 430 can control memory operations of the memory device 400 according to one or more signals or instructions received on control lines 432, including, for example, one or more clock signals or control signals that indicate a desired operation (e.g., write, read, erase, etc.), or address signals (A0-AX) received on one or more address lines 416. One or more devices external to the memory device 400 can control the values of the control signals on the control lines 432, or the address signals on the address line 416. Examples of devices external to the memory device 400 can include, but are not limited to, a host, a memory controller, a processor, or one or more circuits or components not illustrated in FIG. 4.

The memory device 400 can use access lines 406 and first data lines 410 to transfer data to (e.g., write or erase) or from (e.g., read) one or more of the memory cells 404. The row decoder 412 and the column decoder 414 can receive and decode the address signals (A0-AX) from the address line 416, can determine which of the memory cells 404 are to be accessed, and can provide signals to one or more of the access lines 406 (e.g., one or more of a plurality of word lines (WL0-WLm)) or the first data lines 410 (e.g., one or more of a plurality of bit lines (BL0-BLn)), such as described above.

The memory device 400 can include sense circuitry, such as the sense amplifiers 420, configured to determine the values of data on (e.g., read), or to determine the values of data to be written to, the memory cells 404 using the first data lines 410. For example, in a selected string of memory cells 404, one or more of the sense amplifiers 420 can read a logic level in the selected memory cell 404 in response to a read current flowing in the memory array 402 through the selected string to the data lines 410.

One or more devices external to the memory device 400 can communicate with the memory device 400 using the I/O lines (DQ0-DQN) 408, address lines 416 (A0-AX), or control lines 432. The input/output (I/O) circuit 426 can transfer values of data in or out of the memory device 400, such as in or out of the page buffer 422 or the memory array 402, using the I/O lines 408, according to, for example, the control lines 432 and address lines 416. The page buffer 422 can store data received from the one or more devices external to the memory device 400 before the data is programmed into relevant portions of the memory array 402 or can store data read from the memory array 402 before the data is transmitted to the one or more devices external to the memory device 400.

The column decoder 414 can receive and decode address signals (A0-AX) into one or more column select signals (CSEL1-CSELn). The selector 424 (e.g., a select circuit) can receive the column select signals (CSEL1-CSELn) and select data in the page buffer 422 representing values of data to be read from or to be programmed into memory cells 404. Selected data can be transferred between the page buffer 422 and the I/O circuit 426 using second data lines 418.

The memory control unit 430 can receive positive and negative supply signals, such as a supply voltage (Vcc) 434 and a negative supply (Vss) 436 (e.g., a ground potential), from an external source or supply (e.g., an internal or external battery, an AC-to-DC converter, etc.). In certain examples, the memory control unit 430 can include a regulator 428 to internally provide positive or negative supply signals.

Figure 5:
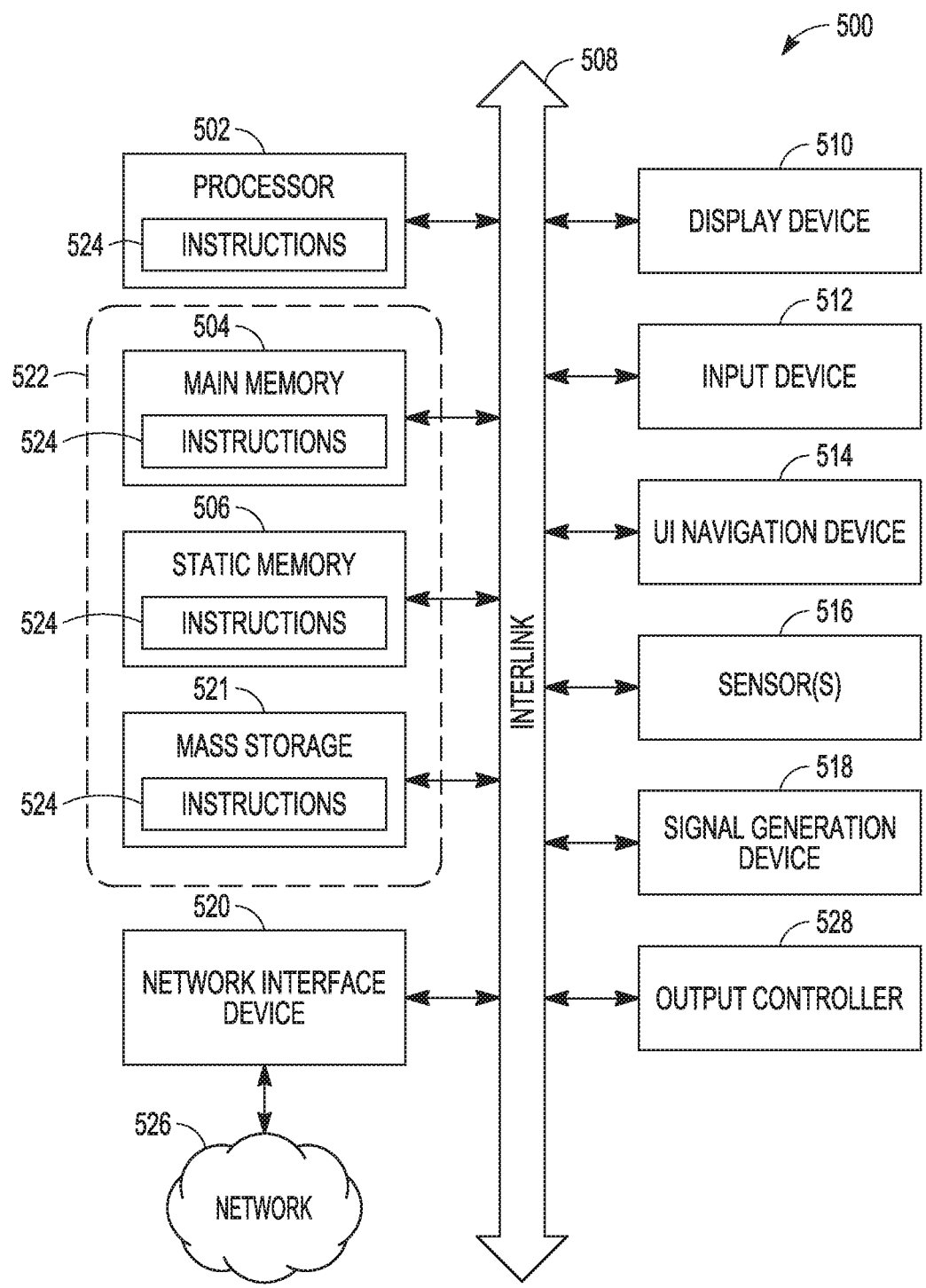
FIG. 5 is a block diagram illustrating an example of a machine upon which a embodiments may be implemented, according to various embodiments.

FIG. 5 illustrates a block diagram of an example machine 500 upon which any one or more of the techniques (e.g., methodologies) discussed herein may perform. In alternative embodiments, the machine 500 may operate as a standalone device or may be connected (e.g., networked) to other machines. In a networked deployment, the machine 500 may operate in the capacity of a server machine, a client machine, or both in server-client network environments. In an example, the machine 500 may act as a peer machine in peer-to-peer (P2P) (or other distributed) network environment. The machine 500 may be a personal computer (PC), a tablet PC, a set-top box (STB), a personal digital assistant (PDA), a mobile telephone, a web appliance, an IoT device, automotive system, or any machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein, such as cloud computing, software as a service (SaaS), other computer cluster configurations.

Examples, as described herein, may include, or may operate by, logic, components, devices, packages, or mechanisms. Circuitry is a collection (e.g., set) of circuits implemented in tangible entities that include hardware (e.g., simple circuits, gates, logic, etc.). Circuitry membership may be flexible over time and underlying hardware variability. Circuitries include members that may, alone or in combination, perform specific tasks when operating. In an example, hardware of the circuitry may be immutably designed to carry out a specific operation (e.g., hardwired). In an example, the hardware of the circuitry may include variably connected physical components (e.g., execution units, transistors, simple circuits, etc.) including a computer-readable medium physically modified (e.g., magnetically, electrically, moveable placement of invariant massed particles, etc.) to encode instructions of the specific operation. In connecting the physical components, the underlying electrical properties of a hardware constituent are changed, for example, from an insulator to a conductor or vice versa. The instructions enable participating hardware (e.g., the execution units or a loading mechanism) to create members of the circuitry in hardware via the variable connections to carry out portions of the specific tasks when in operation. Accordingly, the computer-readable medium is communicatively coupled to the other components of the circuitry when the device is operating. In an example, any of the physical components may be used in more than one member of more than one circuitry. For example, under operation, execution units may be used in a first circuit of a first circuitry at one point in time and reused by a second circuit in the first circuitry, or by a third circuit in a second circuitry at a different time.

The machine (e.g., computer system) 500 (e.g., the host device 105, the memory device 110, etc.) may include a hardware processor 502 (e.g., a central processing unit (CPU), a graphics processing unit (GPU), a hardware processor core, or any combination thereof, such as the memory processing device 115, etc.), a main memory 504 and a static memory 506, some or all of which may communicate with each other via an interlink (e.g., bus) 508. The machine 500 may further include a display device 510, an alphanumeric input device 512 (e.g., a keyboard), and a user interface (UI) navigation device 514 (e.g., a mouse). In an example, the display device 510, input device 512 and UI navigation device 514 may be a touch screen display. The machine 500 may additionally include a storage device (e.g., drive unit) 521, a signal generation device 518 (e.g., a speaker), a network interface device 520, and one or more sensors 516, such as a global positioning system (GPS) sensor, compass, accelerometer, or other sensor. The machine 500 may include an output controller 528, such as a serial (e.g., universal serial bus (USB), parallel, or other wired or wireless (e.g., infrared (IR), near field communication (NFC), etc. connection to communicate or control one or more peripheral devices (e.g., a printer, card reader, etc.).

The storage device 521 may include a machine-readable medium 522 on which is stored one or more sets of data structures or instructions 524 (e.g., software) embodying or utilized by any one or more of the techniques or functions described herein. The instructions 524 may also reside, completely or at least partially, within the main memory 504, within static memory 506, or within the hardware processor 502 during execution thereof by the machine 500. In an example, one or any combination of the hardware processor 502, the main memory 504, the static memory 506, or the storage device 521 may constitute the machine-readable medium 522.

While the machine-readable medium 522 is illustrated as a single medium, the term "machine-readable medium" may include a single medium or multiple media (e.g., a centralized or distributed database, or associated caches and servers) configured to store the one or more instructions 524.

The term "machine-readable medium" may include any medium that is capable of storing, encoding, or carrying instructions for execution by the machine 500 and that cause the machine 500 to perform any one or more of the techniques of the present disclosure, or that is capable of storing, encoding or carrying data structures used by or associated with such instructions. Non-limiting machine-readable medium examples may include solid-state memories, and optical and magnetic media. In an example, a massed machine-readable medium comprises a machine-readable medium with a plurality of particles having invariant (e.g., rest) mass. Accordingly, massed machine-readable media are not transitory propagating signals. Specific examples of massed machine-readable media may include: non-volatile memory, such as semiconductor memory devices (e.g., Electrically Programmable Read-Only Memory (EPROM), Electrically Erasable Programmable Read-Only Memory (EEPROM)) and flash memory devices; magnetic disks, such as internal hard disks and removable disks; magneto-optical disks; and CD-ROM and DVD-ROM disks.

The instructions 524 (e.g., software, programs, an operating system (OS), etc.) or other data are stored on the storage device 521, can be accessed by the memory 504 for use by the processor 502. The memory 504 (e.g., DRAM) is typically fast, but volatile, and thus a different type of storage than the storage device 521 (e.g., an SSD), which is suitable for long-term storage, including while in an "off" condition. The instructions 524 or data in use by a user or the machine 500 are typically loaded in the memory 504 for use by the processor 502. When the memory 504 is full, virtual space from the storage device 521 can be allocated to supplement the memory 504; however, because the storage device 521 is typically slower than the memory 504, and write speeds are typically at least twice as slow as read speeds, use of virtual memory can greatly reduce user experience due to storage device latency (in contrast to the memory 504, e.g., DRAM). Further, use of the storage device 521 for virtual memory can greatly reduce the usable lifespan of the storage device 521.

In contrast to virtual memory, virtual memory compression (e.g., the Linux® kernel feature "ZRAM") uses part of the memory as compressed block storage to avoid paging to the storage device 521. Paging can take place in the compressed block until it is time to write such data to the storage device 521. Virtual memory compression increases the usable size of memory 504, while reducing wear on the storage device 521.

Storage devices optimized for mobile electronic devices, or mobile storage, traditionally include MMC solid-state storage devices (e.g., micro Secure Digital (microSD™) cards, etc.). MMC devices include a number of parallel interfaces (e.g., an 8-bit parallel interface) with a host device, and are often removable and separate components from the host device. In contrast, eMMC™ devices are attached to a circuit board and considered a component of the host device, with read speeds that rival serial ATA™ (Serial AT (Advanced Technology) Attachment, or SATA) based SSD devices. However, demand for mobile device performance continues to increase, such as to fully enable virtual or augmented-reality devices, utilize increasing networks speeds, etc. In response to this demand, storage devices have shifted from parallel to serial communication interfaces. Universal Flash Storage (UFS) devices, including controllers and firmware, communicate with a host device using a low-voltage differential signaling (LVDS) serial interface with dedicated read/write paths, further advancing greater read/write speeds.

The instructions 524 may further be transmitted or received over a communications network 526 using a transmission medium via the network interface device 520 utilizing any one of a number of transfer protocols (e.g., frame relay, internet protocol (IP), transmission control protocol (TCP), user datagram protocol (UDP), hypertext transfer protocol (HTTP), etc.). Example communication networks may include a local area network (LAN), a wide area network (WAN), a packet data network (e.g., the Internet), mobile telephone networks (e.g., cellular networks), Plain Old Telephone (POTS) networks, and wireless data networks (e.g., Institute of Electrical and Electronics Engineers (IEEE) 802.11 family of standards known as Wi-Fi®, IEEE 802.16 family of standards known as WiMax®), IEEE 802.15.4 family of standards, peer-to-peer (P2P) networks, among others. In an example, the network interface device 520 may include one or more physical jacks (e.g., Ethernet, coaxial, or phone jacks) or one or more antennas to connect to the communications network 526. In an example, the network interface device 520 may include a plurality of antennas to wirelessly communicate using at least one of single-input multiple-output (SIMO), multiple-input multiple-output (MIMO), or multiple-input single-output (MISO) techniques. The term "transmission signal" shall be taken to include any signal that is capable of storing, encoding, or carrying instructions for execution by the machine 500, and includes digital or analog communications signals or other signals to facilitate communication of such software.

Figure 6:
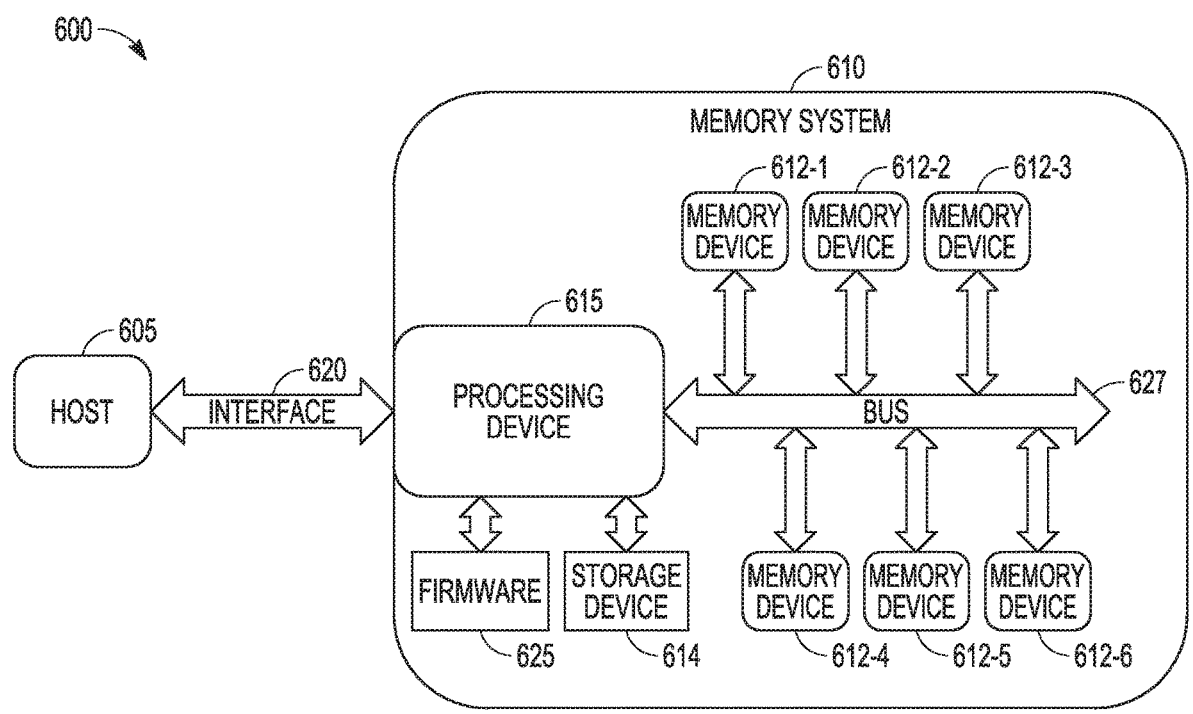
FIG. 6 is a block diagram of an example system including a host that operates with a memory system having multiple memory devices with stacked multiple reliability specifications, according to various embodiments.

FIG. 6 is a block diagram of an embodiment of an example system 600 including a host 605 that operates with a memory system 610 having multiple memory devices with stacked multiple reliability specifications. The stacked multiple reliability specifications can include two or more specifications selected from a data retention specification, a cross temperature delta specification, a number of program erase cycles specification, a number of read cycles specification, and other memory specifications. A program erase cycles specification provides the number of times a NAND cell can erase and write data, without impacting the data information/errors, which determines the endurance of the NAND cell. In other words, the program erase cycles specification provides amount of program erase cycles a NAND cell can withhold without any data loss events. A read cycles specification provides the number of times a NAND cell can read data without impacting data information/errors, which determines the read cycles endurance. In other words, the read cycles specification provides amount of read cycles a NAND cell can withhold without any data loss events.

The host 605 can be coupled to the memory system 610 by an interface 620. The memory system 610 can include a processing device 615 coupled to memory devices 612-1, 612-2, 612-3, 612-4, 612-5, and 612-6 by a bus 627. The memory devices 612-1, 612-2, 612-3, 612-4, 612-5, and 612-6 may be NAND memory devices. Though six memory devices are shown in FIG. 6, the memory system 610 can be implemented with fewer or more than six memory devices, that is, memory system 610 can comprise one or more memory devices. The memory devices can be realized in a number of formats including but not limited to a plurality of memory dies. Each memory device can include an array of memory cells, such as shown for example in FIGS. 2-4, where each memory device can be arranged into multiple blocks with each block arranged having a number of pages. The processing device 615 can include or be structured as one or more processors. The processing device 615 can include instrumentality to perform operations that include operations as a memory controller of the memory system 610.

The memory system 610 can comprise firmware 625 having code executable by the processing device 615 to at least manage the memory devices 612-1, 612-2, 612-3, 612-4, 612-5, and 612-6. The firmware 625 can reside in a storage device of the memory system 610 operatively coupled to the processing device 615. The firmware 625 can be coupled to the processing device 615 using the bus 627 or some other interface on the memory system 610. Alternatively, the firmware 625 can reside in the processing device 615 or can be distributed in the memory system 610 with firmware components, such as but not limited to code, including one or more components in the processing device 615. The firmware 625 can include code having instructions, executable by the processing device 615, to operate on each memory device of the memory devices 612-1, 612-2, 612-3, 612-4, 612-5, and 612-6. The operations can provide a balance between the reliability exposure from refraining from conducting a refresh (upon determining a failed scan without information regarding the source of the failure until a threshold condition other than the failed scan is exceeded) and, at the same time, the minimization of an overkill in refreshing for performance benchmarks. This approach embedded in the firmware can provide an optimization of responses to scan results. The instructions of the firmware can include instructions, for each of the memory devices 612-1, 612-2, 612-3, 612-4, 612-5, and 612-6, to execute a memory scan and implement a trigger of a refresh of a block of the scanned memory based on exceeding a threshold condition for a combination of reliability specifications. The combination of reliability specifications can include a reliability specification different from a data retention specification, as taught herein, where a storage device 614 can be used to log information that can be associated with the reliability specification. The threshold condition can include parameters in addition to criteria associated with each of the reliability specifications. Such parameters can include time of events and/or number of events that have occurred during some interval of operation.

The system 600 and its components can be structured in a number of different arrangements. For example, the system 600 can be arranged with a variation of the type of components that comprise the host 605, the interface 620, the memory system 610, the memory devices 612-1, 612-2, 612-3, 612-4, 612-5, and 612-6, the processing device 615, and the bus 627. The host 605 can comprise one or more processors, which can vary in type. The interface 620 can be arranged as, but not limited to, a peripheral component interconnect express (PCIe) interface. The memory system 610 can be, but is not limited to, a SSD. The memory devices 612-1, 612-2, 612-3, 612-4, 612-5, and 612-6 can be NAND memory devices. The processing device 615 can include or be structured as one or more types of processors compatible with the memory devices 612-1, 612-2, 612-3, 612-4, 612-5, and 612-6. The bus 627 can be an open NAND flash interface (ONFI) bus for the memory devices 612-1, 612-2, 612-3, 612-4, 612-5, and 612-6 being NAND flash memory devices. The storage device 614 can be or included in a RAM. Though storage device 614 is external to processing device 615 in memory system 610 in FIG. 6, the storage device 614 may be integrated into the processing device 615. The storage device 614 can be coupled to the bus 627 for communication with other components of the memory system 610. Alternatively, the storage device 614 can be coupled with processing device 615 in which the processing device 615 handles communications between the storage device 614 and other components of the memory system 610. The storage device 614 can be coupled to the bus 627, with the bus 627 structured to handle different communication protocols for different types of memory devices, and to the processing device 615.

In various embodiments, the firmware 625 can have instructions, executable by the processing device 615, to operate on multiple memory devices of the memory devices 612-1, 612-2, 612-3, 612-4, 612-5, and 612-6, where each memory device includes an array of memory cells organized into one or more blocks having one or more pages. The instructions of the firmware 625 can be executed to perform operations to: log information about a block of the multiple blocks, the information associated with a combination of reliability specifications for the memory device, the combination including a reliability specification different from a data retention specification for the memory device; and trigger a refresh of the block based on exceeding a threshold condition for the combination of reliability specifications. The operations can be applied to each block of the multiple blocks. The trigger of the refresh of the block can include a determination of failure of a scan of the block. The scan can be implemented as a scan of a page of the block being scanned. The specifications for a memory device may be implemented as specifications for the memory devices of the memory device.

In the instructions of the firmware 625, the reliability specification for the memory device in addition to a data retention specification can be one of multiple reliability specifications for the memory device in addition to the data retention specification. The multiple reliability specifications for the memory device can include a cross temperature delta specification, a number of program erase cycles specification, and a number of read cycles specification. For example, the reliability specification, in addition to the data retention specification, used in the instructions of the firmware 625 can be a cross temperature delta specification. The information logged can be information about failure of a scan of the block with a refresh not triggered due to a determined cross temperature delta exceeding a threshold cross temperature delta. Associated with this information, the logged information can include an amount of time after the block is opened, a number of scans after a last refresh, or both the amount of time after the block is opened and the number of scans after a last refresh.

With the reliability specification in addition to a data retention specification being a cross temperature delta specification, the trigger to generate a refresh can be controlled by the data retention specification when a block fails a scan with a determined cross temperature delta being less than a threshold cross temperature delta. In this condition, a refresh can be triggered by the determination of the block failing the scan. With the reliability specification in addition to a data retention specification being a cross temperature delta specification, the threshold condition to trigger the refresh for the combination of reliability specifications can include a threshold power-on time when the block fails a scan with a determined cross temperature delta exceeding a threshold cross temperature delta. The block can have an erase count equal to an erase count of a last scan. Alternatively, the threshold condition to trigger the refresh for the combination of reliability specifications can include a threshold number of scans after a last refresh, when the block fails a scan with a determined cross temperature delta exceeding a threshold cross temperature delta. The block can have an erase count equal to an erase count of a last scan.

The system 600 can include a temperature sensor to generate temperature data with respect to scanning blocks of the memory devices 612-1, 612-2, 612-3, 612-4, 612-5, and 612-6. Multiple temperature sensors can be implemented to generate the temperature data. A temperature sensor can be included internal to each memory device of the multiple memory devices. With the memory devices arranged as multiple planes, a different temperature sensor can be associated with each plane. In various embodiment with memory devices arranged as multiple planes with each plane having multiple sections, a different temperature sensor can be associated with each section. Temperature sensors of the system 600 can include a temperature sensor of the processing device 615.

Figure 7:
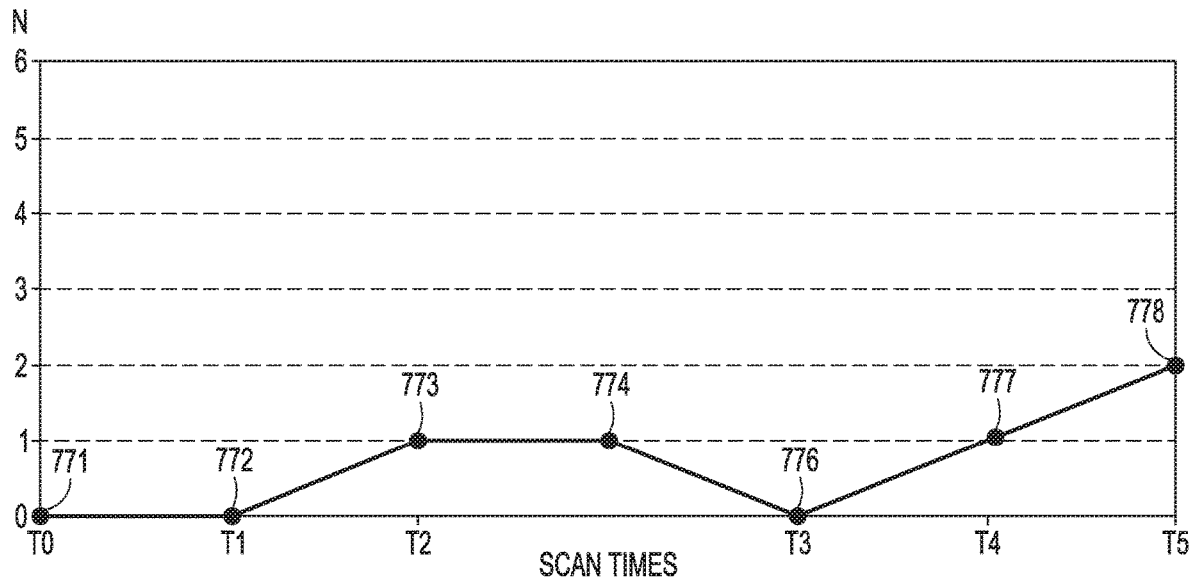
FIG. 7 is an illustration showing an example case scenario for scan optimization in which use of a number of scans parameter is implemented in a threshold condition to trigger a refresh of a block of a memory device, according to various embodiments.

FIG. 7 is an illustration showing an example case scenario for scan optimization in which use of a number of scans parameter is implemented in a threshold condition to trigger a refresh of a block of a memory device. The number of scans, N, is the number of scans executed with the cross temperature delta exceeding the threshold cross temperature delta, since a last refresh of a block. N can be used as a variable to determine when a refresh is to be triggered when a scan fails along with a cross-temperature delta being greater than a threshold for a cross-temperature delta. The threshold number of scans with respect to a cross-temperature delta to trigger a refresh can be determined based on retention criteria defined for the memory device under test. In this example presentation, the threshold number of scans with respect to a cross-temperature delta exceeding the threshold cross temperature delta since the block was last refreshed is set at two. The threshold for a cross-temperature delta with respect to N may be set to less than two or to more than two and can be set in a storage device for firmware used to control the memory device.

FIG. 7 shows a number of scans of a block of memory at a number of scan times. The block of the memory device can be scanned at set times. The set times shown in this example are T0, T1, T3, T4, and T5. The set times can be selected with respect to an amount of allowable bake time that the block can incur according to a specification for the memory device. The set scan times can continue during the operational lifetime of the memory device. The scan times can be set to periodically scan the memory device at a set rate. In this example, T0 is an initial time, with the number of times that data of a block of memory has been scanned since the last refresh of this data set to zero, i.e., N=0. In addition, the erasure count (EC) of this block is at some number, x, which can be monitored with counter as EC=x. At T0, the block is flagged for a scan, which, in this example scenario, results in a condition 771 in which the block passes a correctable error correction code (CECC) error count criteria, and a check of a corresponding cross temperature delta for the corresponding scan results in the cross temperature delta being less than a threshold cross temperature delta for the memory device. Since the scan passes the correctable error correction code (CECC) error count criteria, it does not fail the scan. Since the scan does not fail, and the corresponding cross temperature delta is less than the threshold cross temperature delta, no action is taken. No action taken includes no fresh, no change of the value of the parameter N, and no change of the value of the parameter EC.

At T1, the block is flagged for a scan with N=0 and EC=x at the start of the scan, since no activity with respect to scans and refreshes has occurred since T0. In this example, at T1 the block is scanned with the resulting condition 772, in which the block has failed the CECC error count criteria and the determined cross temperature delta for this block at this scan time is greater than the threshold cross temperature delta. However, in this example, the threshold number of scans with respect to a cross-temperature delta to trigger a refresh is set at two. Therefore, with N=0 at the start of the scan at T1, no refresh is performed, and N is set to N=1.

At T2, the block is flagged for a scan due to a power-up within a short duration rather than a set time between scans. At the start of the scan at T2, N=1 and EC=x, since no activity with respect to scans and refreshes has occurred since T0. In this example, at T2 the block is scanned with the resulting condition 773, in which the block has failed the CECC error count criteria and the determined cross temperature delta for this block at this scan time is greater than the threshold cross temperature delta. However, with the occurrence of the power up, no action with respect to a refresh is taken and N is kept at N=1.

The next scheduled scan time is T3. However, in this example, an event occurs between T2 and T3, where from T2, N=1 and EC=x. Condition 774 results from an event in which the block was refreshed by a host command or by a garbage collection occurrence. This refresh increases the erase count. Then, in response to this refresh, N is updated to N=0 right after the refresh, since no scans have been conducted since this refresh. At this point, the new condition for the block is N=0, EC=x+1.

At T3, the block is flagged for scan with N=0 and EC=x+1 at the start of the scan, since no activity with respect to scans and refreshes has occurred since the above refresh between T2 and T3. In this example, at T3 the block is scanned with the resulting condition 776, in which the block has failed the CECC error count criteria and the determined cross temperature delta for this block at this scan time is greater than the threshold cross temperature delta. With the threshold number of scans with respect to a cross-temperature delta to trigger a refresh set at two and with N=0 at the start of the scan at T3, no refresh is performed, and N is set to N=1. The value of EC remains at EC=x+1.

At T4, the block is flagged for scan with N=1 and EC=x+1 at the start of the scan, since no activity with respect to scans and refreshes has occurred since T3. In this example, at T4 the block is scanned with the resulting condition 777, in which the block has failed the CECC error count criteria and the determined cross temperature delta for this block at this scan time is greater than the threshold cross temperature delta. With the threshold number of scans with respect to a cross-temperature delta to trigger a refresh set at two and with N=1 at the start of the scan at T4, no refresh is performed, and N is set to N=2 after the scan at T4. The value of EC remains at EC=x+1.

At T5, the block is flagged for scan with N=2 and EC=x+1 at the start of the scan, since no activity with respect to scans and refreshes has occurred since T4. In this example, at T5 the block is scanned with the resulting condition 778, in which the block has failed the CECC error count criteria and the determined cross temperature delta for this block at this scan time is greater than the threshold cross temperature delta. After the scan at T5, the number of scans exceeds the threshold number of scans with respect to a cross-temperature delta to trigger a refresh that was set at two. Since after the scan, the block has failed the CECC error count criteria, the determined cross temperature delta for this block at this scan time is greater than the threshold cross temperature delta, and the number of scans since the last refresh exceeds the respective threshold, a refresh is forced. Following the forced refresh, the value of N is set to N=0 and the value of EC is updated to x+2.

Essentially, a procedure such as illustrated in FIG. 7 avoids forcing a number of refreshes, which may not be needed. At the same time, the procedure keeps a combination of a check of the amount of time that the block has gone through bake and also a check of the cross temperature delta. Such a combination allows a determination of whether to conduct a refresh.

Figure 8:
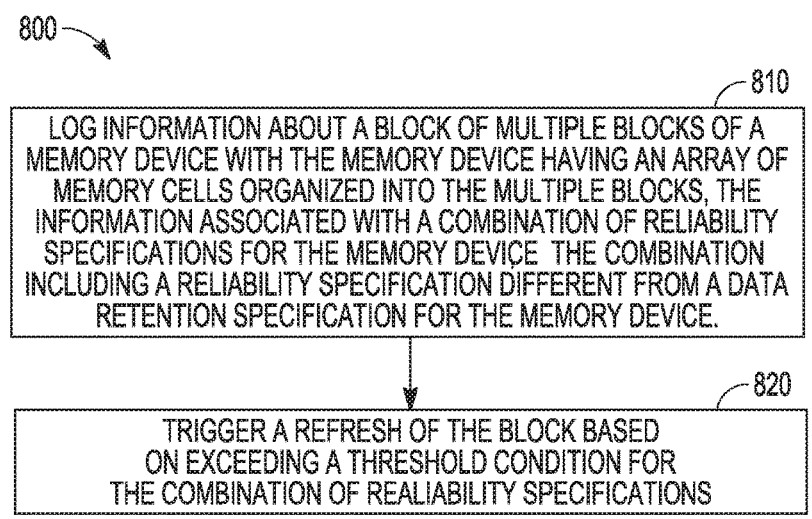
FIG. 8 is a block diagram of features of an example method of optimizing actions from a scan of a memory device with respect to stacking of multiple reliability specifications for the memory device, according to various embodiments.

FIG. 8 is a block diagram of features of an embodiment of an example method 800 of optimizing actions from a scan of a memory device with respect to stacking of multiple reliability specifications for the memory device. Method 800 can be implemented using a processing device executing instructions stored in firmware. At 810, information about a block of multiple blocks of a memory device is logged, where the information is associated with a combination of reliability specifications for the memory device, the combination including a reliability specification different from a data retention specification for the memory device. The combination of reliability specifications can have a threshold condition for triggering a refresh. The memory device can have an array of memory cells organized into the multiple blocks. At 820, a refresh of the block is triggered based on exceeding threshold condition for the combination of reliability specifications.

Variations of method 800 or methods similar to method 800 can include a number of different embodiments that may be combined depending on the application of such methods and/or the architecture of systems in which such methods are implemented. Such methods can include determining failure of a scan of the block and, with the reliability specification different from a data retention specification being a cross temperature delta specification, logging the information associated with the failure of the scan of the block with a refresh not triggered due to a determined cross temperature delta exceeding a threshold cross temperature delta. The logged information can include an amount of time after the block is opened, a number of scans after a last refresh, or both the amount of time after the block is opened and the number of scans after a last refresh.

Variations of method 800 or methods similar to method 800 can include the reliability specification different from a data retention specification being a cross temperature delta specification. The threshold condition to trigger the refresh with the combination of reliability specifications including the cross temperature delta specification can include a threshold power-on time when the block fails a scan with a determined cross temperature delta exceeding a threshold cross temperature delta. The block can have an erase count equal to an erase count of a last scan.

Variations of method 800 or methods similar to method 800 can include the reliability specification different from a data retention specification being a cross temperature delta specification, with the threshold condition to trigger the refresh f with the combination of reliability specifications including the cross temperature delta specification including a threshold number of scans after a last refresh. This threshold condition can include the block failing a scan with a determined cross temperature delta exceeding a threshold cross temperature delta. The block can have an erase count equal to an erase count of a last scan. The threshold number of scans after a last refresh can be a threshold number of scans with a determined cross temperature delta exceeding a threshold cross temperature delta after a last refresh.

Firmware for operation of a memory device can comprise instructions, such as a microcode, which when executed by a processing device, can cause performance of operations, the operations including operations to: log information about a block of multiple blocks of a memory device, the information associated with a combination of reliability specifications for the memory device, the combination including a reliability specification different from a data retention specification for the memory device; and trigger a refresh of the block based on exceeding a threshold condition for the combination of reliability specifications. The instructions may be structured for the memory device being a NAND memory device. The processing device can be a controller such as a memory controller.

Variations of instructions of the above firmware or similar firmware can include a number of different embodiments that may be combined depending on the application of such firmware and/or the architecture of systems in which such firmware is implemented. Such instructions of the firmware, which when executed by a processing device, can cause performance of operations, which operations can include a determination of failure of a scan of the block, and, with the reliability specification of a combination of reliability specifications being a cross temperature delta specification, a logging of the information associated with the failure of the scan of the block with a refresh not triggered due to a determined cross temperature delta exceeding a threshold cross temperature delta. The logged information can include an amount of time after the block is opened, a number of scans after a last refresh, or both the amount of time after the block is opened and the number of scans after a last refresh.

Instructions of the firmware, which when executed by a controller, can cause performance of operations, where operations can include the reliability specification for the memory device in the combination of reliability specifications being a cross temperature delta specification and the threshold condition to trigger the refresh for the combination of reliability specifications can include a threshold power-on time, when the block fails a scan with a determined cross temperature delta exceeding a threshold cross temperature delta. The block can have an erase count equal to an erase count of a last scan.

Instructions of the firmware, which when executed by a controller, can cause performance of operations, where operations can include the reliability specification for the memory device in the combination of reliability specifications being a cross temperature delta specification and the threshold condition to trigger the refresh for the combination of reliability specifications can include a threshold number of scans after a last refresh, when the block fails a scan with a determined cross temperature delta exceeding a threshold cross temperature delta. The block can have an erase count equal to an erase count of a last scan. The threshold number of scans after a last refresh can be a threshold number of scans with a determined cross temperature delta exceeding a threshold cross temperature delta after a last refresh.

In various embodiments, a system can comprise: a processing device; a memory device including an array of memory cells, the memory device organized into multiple blocks; and firmware having stored instructions, executable by the processing device, to perform operations. The operations can include operations to: log information about a block of the multiple blocks, the information associated with a combination of reliability specifications for the memory device, the combination including a reliability specification different from a data retention specification for the memory device; and trigger a refresh of the block based on exceeding a threshold condition for the combination of reliability specifications. The trigger of the refresh of the block can include a determination of failure of a scan of the block. The reliability specification can be a cross temperature delta specification. The operations can be operations applied to each block of the multiple blocks.

The reliability specification in the combination of reliability specifications for the memory device can be one of multiple reliability specifications for the memory device in addition to a data retention specification. The multiple reliability specifications for the memory device can include a cross temperature delta specification, a number of program erase cycles specification, and a number of read cycles specification.

Variations of a system, as taught herein, can include a number of different embodiments that may be combined depending on the application of such systems and/or the architecture in which systems are implemented. The information logged can be information about failure of a scan of the block with a refresh not triggered due to a determined cross temperature delta exceeding a threshold cross temperature delta. The logged information can include an amount of time after the block is opened, a number of scans after a last refresh, or both the amount of time after the block is opened and the number of scans after a last refresh.

Variations of a system, as taught herein, can include the threshold condition to trigger the refresh for the combination of reliability specifications to include a threshold power-on time when the block fails a scan with a determined cross temperature delta exceeding a threshold cross temperature delta. The block can have an erase count equal to an erase count of a last scan.

Variations of a system, as taught herein, can include the threshold condition to trigger the refresh for the combination of reliability specifications to include a threshold number of scans after a last refresh, when the block fails a scan with a determined cross temperature delta exceeding a threshold cross temperature delta. The block can have an erase count equal to an erase count of a last scan. The threshold number of scans after a last refresh can be a threshold number of scans with a determined cross temperature delta exceeding a threshold cross temperature delta after a last refresh.

In various embodiments, a system can comprise: a processing device; multiple memory devices, each memory device of the multiple memory devices having an array of memory cells, each memory device organized into multiple blocks; a temperature sensor to measure temperatures associated with writing data to a block and reading the data from the block; and firmware having stored instructions, executable by the processing device, to perform operations on each memory device of the multiple memory devices. The operations can include operations to: log information about a block of the multiple blocks, the information associated with a combination of reliability specifications for the block, the combination including a reliability specification different from a data retention specification for the memory device; and trigger a refresh of the block based on exceeding a threshold condition for the combination of reliability specifications. The trigger of the refresh of the block can include a determination of failure of a scan of the block. The reliability specification in the combination that is different from a data retention specification can be a cross temperature delta specification.

Variations of a system, as taught herein, can include a number of different embodiments that may be combined depending on the application of such systems and/or the architecture in which systems are implemented. In such systems, the logged information can include an amount of time after the block is opened, a number of scans after a last refresh, or both the amount of time after the block is opened and the number of scans after a last refresh. Further, such systems can include a number of temperature sensors to generate temperature data. Temperature sensors of such systems can include a temperature sensor internal to each memory device of the multiple memory devices. A temperature sensor of such systems may include a temperature sensor of the processing device.

In various embodiments, a system can comprise: a processing device; a memory device including an array of memory cells, the memory device organized into multiple blocks; and firmware having stored instructions, executable by the processing device, to perform operations. The operations can include operations to: log information for each block of the multiple blocks that fails a scan, but is not triggered for a refresh due to a cross temperature delta exceeding a cross temperature delta threshold; and trigger a refresh of each block that failed the scan with the cross temperature delta exceeding a cross temperature delta threshold with a power-on time exceeding a threshold power-on time or with a number of scans after a last refresh exceeding a threshold number of scans after a last refresh. Each block triggered for refresh can have an erase count equal to an erase count of a last scan.

Variations of a system, as taught herein, can include a number of different embodiments that may be combined depending on the application of such systems and/or the architecture in which systems are implemented. The threshold number of scans after a last refresh can equal two. The threshold number of scans after a last refresh can be less than or more than two. The memory device can include a temperature sensor. The memory device can be arranged as multiple planes with each plane having a temperature sensor. Such a system or similar system can include multiple memory devices with some or all the memory devices structured in a common format with respect to operation with respect to a combination of reliability specifications. Such a system or similar system can include any number of the features taught herein.

The following are example embodiments of systems and methods, in accordance with the teachings herein.

An example system 1 can comprise: firmware having stored instructions, executable by a processing device, to perform operations to: log information about a block of multiple blocks of a memory device, the information associated with a combination of reliability specifications for the memory device, the combination including a reliability specification different from a data retention specification for the memory device; and trigger a refresh of the block based on exceeding a threshold condition for the combination of reliability specifications.

An example system 2 can include features of example system 1 and can include the trigger of the refresh of the block including a determination of failure of a scan of the block.

An example system 3 can include features of any of the preceding example systems and can include the reliability specification different from the data retention specification being a cross temperature delta specification.

An example system 4 can include features of any of the preceding example systems and can include the information logged being information about failure of a scan of the block with a refresh not triggered due to a determined cross temperature delta exceeding a threshold cross temperature delta.

An example system 5 can include features of any of the preceding example systems and can include the logged information to include an amount of time after the block is opened, a number of scans after a last refresh, or both the amount of time after the block is opened and the number of scans after a last refresh.

An example system 6 can include features of any of the preceding example systems and can include the threshold condition to trigger the refresh for the combination of reliability specifications to include a threshold power-on time when the block fails a scan with a determined cross temperature delta exceeding a threshold cross temperature delta, the block having an erase count equal to an erase count of a last scan.

An example system 7 can include features of any of the preceding example systems and can include the threshold condition to trigger the refresh for the combination of reliability specifications to include a threshold number of scans after a last refresh, when the block fails a scan with a determined cross temperature delta exceeding a threshold cross temperature delta, the block having an erase count equal to an erase count of a last scan.

An example system 8 can include features of any of the preceding example systems and can include the combination of reliability specifications to include the data retention specification and the reliability specification different from the data retention specification is one of multiple reliability specifications for the block different from the data retention specification.

An example system 9 can include features of any of the preceding example systems and can include the multiple reliability specifications for the memory device to include a cross temperature delta specification, a number of program erase cycles specification, and a number of read cycles specification.

An example system 10 can include features of any of the preceding example systems and can include the operations being operations applied to each block of the multiple blocks.

An example system 11 can comprise: a processing device; a memory device having an array of memory cells organized into multiple blocks; the processing device coupled to the memory device to perform operations on the memory device to: log information about a block of the multiple blocks, the information associated with a combination of reliability specifications for the memory device, the combination including a reliability specification different from a data retention specification for the memory device; and trigger a refresh of the block based on exceeding a threshold condition for the combination of reliability specifications.

An example system 12 can include features of example system 11 and can include a temperature sensor to measure temperatures associated with writing data to the memory device and reading the data from the memory device.

An example system 13 can include features of any of the preceding example systems 11 and 12 and can include the temperature sensor to include a temperature sensor internal to the memory device.

An example system 14 can include features of any of the preceding example systems 11-13 and can include the temperature sensor to include a temperature sensor of the processing device.

An example system 15 can include features of any of the preceding example systems 11-14 and can comprise: an additional memory device having an array of memory cells organized into additional multiple blocks, wherein the processing device is coupled to the additional memory device to perform operations on the additional memory device to: log information about a block of the additional multiple blocks, the information associated with a combination of reliability specifications for the memory device, the combination including a reliability specification different from a data retention specification for the memory device; and trigger a refresh of the block based on exceeding a threshold condition for the combination of reliability specifications.

An example system 16 can include features of any of the preceding example systems 11-15 and can include the logged information to include an amount of time after the block is opened, a number of scans after a last refresh, or both the amount of time after the block is opened and the number of scans after a last refresh.

An example method 1 can comprise: logging information about a block of multiple blocks of a memory device with the memory device having an array of memory cells organized into the multiple blocks, the information associated with a combination of reliability specifications for the block, the combination including a reliability specification different from a data retention specification for the memory device; and triggering a refresh of the block based on exceeding a threshold condition for the combination of reliability specifications.

An example method 2 can include features of example method 1 and can include determining failure of a scan of the block; and, with the reliability specification different from a data retention specification being a cross temperature delta specification, logging the information associated with the failure of the scan of the block with a refresh not triggered due to a determined cross temperature delta exceeding a threshold cross temperature delta, the logged information to include an amount of time after the block is opened, a number of scans after a last refresh, or both the amount of time after the block is opened and the number of scans after a last refresh.

An example method 3 can include features of any of the preceding example methods and can include the reliability specification different from a data retention specification being a cross temperature delta specification and the threshold condition to trigger the refresh for the combination of reliability specifications to include a threshold power-on time when the block fails a scan with a determined cross temperature delta exceeding a threshold cross temperature delta, the block having an erase count equal to an erase count of a last scan.

An example method 4 can include features of any of the preceding example methods and can include the reliability specification different from the data retention specification for the memory device being a cross temperature delta specification and the threshold condition to trigger the refresh for the combination of reliability specifications to include a threshold number of scans after a last refresh when the block fails a scan with a determined cross temperature delta exceeding a threshold cross temperature delta, the block having an erase count equal to an erase count of a last scan.

An example method 5 can include features of any of the preceding example methods and can include performing functions associated with any features of example systems 1-16 and example systems 17-21.

An example system 17 can comprise: a processing device; a memory device including an array of memory cells, the memory device organized into multiple blocks; and firmware having stored instructions, executable by the processing device, to perform operations, including operations to: log information for each block of the multiple blocks that fails a scan, but is not triggered for a refresh due to a cross temperature delta exceeding a cross temperature delta threshold; and trigger a refresh of each block that failed the scan with the cross temperature delta exceeding a cross temperature delta threshold with a power-on time exceeding a threshold power-on time or with a number of scans after a last refresh exceeding a threshold number of scans after a last refresh.

An example system 18 can include features of example system 17 and can include each block triggered for refresh having an erase count equal to an erase count of a last scan.

An example system 19 can include features of any of the preceding example systems 17 and 18 and can include the threshold number of scans after a last refresh being equal to two.

An example system 20 can include features of any of the preceding example systems 17-19 and can include the memory device to include a temperature sensor.

An example system 21 can include features of any of the preceding example systems 17-20 and can include the memory device being arranged as multiple planes with each plane having a temperature sensor.

In various examples, the components, controllers, processors, units, engines, or tables described herein can include, among other things, physical circuitry or firmware stored on a physical device. As used herein, "processor" means any type of computational circuit such as, but not limited to, a microprocessor, a microcontroller, a graphics processor, a digital signal processor (DSP), or any other type of processor or processing circuit, including a group of processors or multi-core devices.

Operating a memory cell, as used herein, includes reading from, writing to, or erasing the memory cell. The operation of placing a memory cell in an intended state is referred to herein as "programming," and can include both writing to or erasing from the memory cell (e.g., the memory cell may be programmed to an erased state).

According to one or more embodiments, a memory controller (e.g., a processor, controller, firmware, etc.) located internal or external to a memory device, is capable of determining (e.g., selecting, setting, adjusting, computing, changing, clearing, communicating, adapting, deriving, defining, utilizing, modifying, applying, etc.) a quantity of wear cycles, or a wear state (e.g., recording wear cycles, counting operations of the memory device as they occur, tracking the operations of the memory device it initiates, evaluating the memory device characteristics corresponding to a wear state, etc.

According to one or more embodiments, a memory access device may be configured to provide wear cycle information to the memory device with each memory operation. The memory device control circuitry (e.g., control logic) may be programmed to compensate for memory device performance changes corresponding to the wear cycle information. The memory device may receive the wear cycle information and determine one or more operating parameters (e.g., a value, characteristic) in response to the wear cycle information.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer-readable instructions for performing various methods. The code may form portions of computer program products. Further, the code can be tangibly stored on one or more volatile or non-volatile tangible computer-readable media, such as during execution or at other times. Examples of these tangible computer-readable media can include, but are not limited to, hard disks, removable magnetic disks, removable optical disks (e.g., compact discs and digital video disks), magnetic cassettes, memory cards or sticks, random access memories (RAMs), read only memories (ROMs), solid state drives (SSDs), Universal Flash Storage (UFS) device, embedded MMC (eMMC) device, and the like.

Although specific embodiments have been illustrated and described herein, it will be appreciated by those of ordinary skill in the art that any arrangement that is calculated to achieve the same purpose may be substituted for the specific embodiments shown. Various embodiments use permutations and/or combinations of embodiments described herein. It is to be understood that the above description is intended to be illustrative, and not restrictive, and that the phraseology or terminology employed herein is for the purpose of description. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Thus, the following claims are hereby incorporated into the Detailed Description, with each claim standing on its own as a separate embodiment.

What is claimed is:

1. A system comprising:
    firmware having stored instructions, executable by a processing device, to perform operations to:
        log information about a block of multiple blocks of a memory device, the information associated with a combination of reliability specifications for the memory device, wherein at least one reliability specification of the combination is different data retention specification for the memory device; and
        trigger a refresh of the block based on exceeding a threshold condition for the at least one reliability specification, in response to a determination of a failure of a scan of the block with the threshold condition for the at least one reliability specification being exceeded for multiple scans executed since a last refresh of the block.

2. The system of claim 1, wherein a number setting the multiple scans executed since a last refresh of the block is stored in a storage device for firmware used to control the memory device.

3. The system of claim 1, wherein the at least one reliability specification different from the data retention specification is a cross temperature delta specification.

4. The system of claim 3, wherein the information logged is information about failure of a scan of the block with a refresh not triggered due to a determined cross temperature delta exceeding a threshold cross temperature delta.

5. The system of claim 4, wherein the logged information includes an amount of time after the block is opened, a number of scans after a last refresh, or both the amount of time after the block is opened and the number of scans after a last refresh.

6. A system comprising:
    firmware having stored instructions, executable by a processing device, to perform operations to:
        log information about a block of multiple blocks of a memory device, the information associated with a combination of reliability specifications for the memory device, the combination including a reliability specification different from a data retention specification for the memory device, wherein the reliability specification different from the data retention specification is a cross temperature delta specification; and trigger a refresh of the block based on exceeding a threshold condition for the combination of reliability specifications, wherein the threshold condition to trigger the refresh for the cross temperature delta specification includes a threshold power-on time when the block fails a scan with a determined cross temperature delta exceeding a threshold cross temperature delta.

7. A system comprising:
firmware having stored instructions, executable by a processing device, to perform operations to:
log information about a block of multiple blocks of a memory device, the information associated with a combination of reliability specifications for the memory device, the combination including a reliability specification different from a data retention specification for the memory device, wherein the reliability specification different from the data retention specification is a cross temperature delta specification; and
trigger a refresh of the block based on exceeding a threshold condition for the combination of reliability specifications, wherein the threshold condition to trigger the refresh for the cross temperature delta specification includes a threshold number of scans after a last refresh, when the block fails a scan with a determined cross temperature delta exceeding a threshold cross temperature delta.

8. The system of claim 1, wherein the combination of reliability specifications includes the data retention specification and the at least one reliability specification different from the data retention specification, with the at least one reliability specification being one of multiple reliability specifications for the memory device different from the data retention specification.

9. The system of claim 8, wherein the multiple reliability specifications for the memory device include a cross temperature delta specification, a number of program erase cycles specification, and a number of read cycles specification.

10. The system of claim 1, wherein the operations are operations applied to each block of the multiple blocks.

11. A system comprising:
a processing device;
a memory device having an array of memory cells organized into multiple blocks;
the processing device coupled to the memory device to perform operations on the memory device to:
log information about a block of the multiple blocks, the information associated with a combination of reliability specifications for the memory device, wherein at least one reliability specification of the combination is different from a data retention specification for the memory device; and
trigger a refresh of the block based on exceeding a threshold condition for the at least one reliability specification, in response to a determination of a failure of a scan of the block with the threshold condition for the at least one reliability specification being exceeded for multiple scans executed since a last refresh of the block.

12. The system of claim 11, comprising:
a temperature sensor to measure temperatures associated with writing data to the memory device and reading the data from the memory device.

13. The system of claim 12, wherein the temperature sensor includes a temperature sensor internal to the memory device.

14. The system of claim 12, wherein the temperature sensor includes a temperature sensor of the processing device.

15. The system of claim 11, comprising:
an additional memory device having an array of memory cells organized into additional multiple blocks, wherein the processing device is coupled to the additional memory device to perform operations on the additional memory device to:
log information about a block of the additional multiple blocks, the information associated with a combination of reliability specifications for the memory device, the combination including a reliability specification different from a data retention specification for the memory device; and
trigger a refresh of the block based on exceeding a threshold condition for the combination of reliability specifications.

16. The system of claim 11, wherein the logged information includes an amount of time after the block is opened, a number of scans after a last refresh, or both the amount of time after the block is opened and the number of scans after a last refresh.

17. A method comprising:
logging information about a block of a memory device having an array of memory cells organized into multiple blocks, the information associated with a combination of reliability specifications for the memory device, wherein at least one reliability specification of the combination is different from a data retention specification for the memory device; and
triggering a refresh of the block based on exceeding a threshold condition for the at least one reliability specification, in response to a determination of a failure of a scan of the block with the threshold condition for the at least one reliability specification being exceeded for multiple scans executed since a last refresh of the block.

18. The method of claim 17, wherein the method includes:
with the reliability specification being a cross temperature delta specification, logging the information associated with the failure of the scan of the block with a refresh not triggered due to a determined cross temperature delta exceeding a threshold cross temperature delta, the logged information including an amount of time after the block is opened, a number of scans after a last refresh, or both the amount of time after the block is opened and the number of scans after a last refresh.

19. A method comprising:
logging information about a block of a memory device having an array of memory cells organized into multiple blocks, the information associated with a combination of reliability specifications for the memory device, the combination including a reliability specification different from a data retention specification for the memory device; and
triggering a refresh of the block based on exceeding a threshold condition for the combination of reliability specifications, wherein the reliability specification different from the data retention specification for the memory device is a cross temperature delta specification and the threshold condition to trigger the refresh for the combination of reliability specifications includes a threshold power-on time when the block fails a scan with a determined cross temperature delta exceeding a threshold cross temperature delta.

20. A method comprising;
logging information about a block of a memory device having an array of memory cells organized into the multiple blocks, the information associated with a combination of reliability specifications for the memory device, the combination including a reliability specification different from a data retention specification for the memory device; and triggering a refresh of the block based on exceeding a threshold condition for the combination of reliability specifications, wherein the reliability specification different from the data retention specification for the memory device is a cross temperature delta specification and the threshold condition to trigger the refresh for the combination of reliability specifications includes a threshold number of scans after a last refresh when the block fails a scan with a determined cross temperature delta exceeding a threshold cross temperature delta, the block having an erase count equal to an erase count of a last scan.

21. A system comprising:
a processing device;
a memory device including an array of memory cells, the memory device organized into multiple blocks; and
firmware having stored instructions, executable by the processing device, to perform operations, including operations to:
log information for each block of the multiple blocks that fails a scan, but is not triggered for a refresh due to a cross temperature delta exceeding a cross temperature delta threshold; and
trigger a refresh of each block that failed the scan with the cross temperature delta exceeding a cross temperature delta threshold with a power-on time exceeding a threshold power-on time or with a number of scans after a last refresh exceeding a threshold number of scans after a last refresh.

22. The system of claim 21, wherein each block triggered for refresh has an erase count equal to an erase count of a last scan.

23. The system of claim 21, wherein the threshold number of scans after a last refresh equals two.

24. The system of claim 21, wherein the memory device includes a temperature sensor.

25. The system of claim 21, wherein the memory device is arranged as multiple planes with each plane having a temperature sensor.

\* \* \* \* \*

UNITED STATES PATENT AND TRADEMARK OFFICE
CERTIFICATE OF CORRECTION

PATENT NO. : 10,892,024 B2
APPLICATION NO. : 16/232185
DATED : January 12, 2021
INVENTOR(S) : Vashi et al.

Page 1 of 1

It is certified that error appears in the above-identified patent and that said Letters Patent is hereby corrected as shown below:

In Column 28, Line 31, in Claim 1, after "different", insert --from a--

In Column 31, Line 3, in Claim 20, delete "comprising;" and insert --comprising:-- therefor Signed and Sealed this
Sixteenth Day of March, 2021

Drew Hirshfeld
*Performing the Functions and Duties of the*
*Under Secretary of Commerce for Intellectual Property and*
*Director of the United States Patent and Trademark Office*